United States Patent [19]

Otaka et al.

[11] Patent Number: 5,412,209
[45] Date of Patent: May 2, 1995

[54] ELECTRON BEAM APPARATUS

[75] Inventors: Tadashi Otaka; Akimitsu Okura, both of Katsuta; Hiroshi Iwamoto, Ibaraki; Hideo Todokoro; Tsutomu Komoda, both of Tokyo; Issei Tobita, Mito, all of Japan

[73] Assignee: Hitachi, Ltd., Tokyo, Japan

[21] Appl. No.: 982,768

[22] Filed: Nov. 27, 1992

[30] Foreign Application Priority Data

Nov. 27, 1991 [JP] Japan .................. 3-335981
Nov. 27, 1991 [JP] Japan .................. 3-335985
Nov. 27, 1991 [JP] Japan .................. 3-335986

[51] Int. Cl.6 .................................. H01J 37/14
[52] U.S. Cl. ........................... 250/310; 250/396 ML
[58] Field of Search ............... 250/310, 396 ML, 397

[56] References Cited

U.S. PATENT DOCUMENTS

| 4,071,759 | 1/1978 | Namae | 250/310 |
|---|---|---|---|
| 4,714,833 | 12/1987 | Rose et al. | 250/310 |
| 4,728,790 | 3/1988 | Plies | 250/310 |
| 4,922,097 | 5/1990 | Todokoro et al. | 250/310 |
| 4,926,054 | 5/1990 | Frosien | 250/310 |
| 4,928,010 | 5/1990 | Saito et al. | 250/310 |
| 4,982,091 | 1/1991 | Garth et al. | 250/310 |
| 4,999,496 | 3/1991 | Shaw et al. | 250/310 |
| 5,006,795 | 4/1991 | Yoshizawa et al. | |
| 5,032,725 | 7/1991 | Kanda | 250/310 |

FOREIGN PATENT DOCUMENTS

| 290620 | 11/1988 | European Pat. Off. |
| 3621045 | 1/1987 | Germany . |
| 4020806 | 1/1991 | Germany . |
| 46-24459 | 3/1971 | Japan . |
| 51-36150 | 6/1976 | Japan . |
| 52-20819 | 11/1977 | Japan . |
| 59-190610 | 10/1984 | Japan . |

OTHER PUBLICATIONS

Review of Scientific Instruments, vol. 60, No. 11, 1189, New York US, pp. 3434–3441, Z. Shao, "High-resolution low-voltage electron optical system for very large specimen".

Journal of Vacuum Science and Technology: Part B, vol. 8, No. 5, 990, New York US, pp. 1152–1157, K. Saito et al., "A scanning electron microscope for trench observation".

Primary Examiner—Bruce C. Anderson
Attorney, Agent, or Firm—Antonelli, Terry, Stout & Kraus

[57] ABSTRACT

An electron beam apparatus comprises an electron beam source, a unit for irradiating an electron beam on a specimen, a detector for secondary electrons, an electrode for generating an electric field sufficient to draw out secondary electrons in a recess in the specimen from the recess, and a unit for generating a magnetic field for focusing secondary electrons drawn out of the recess. With this construction, the secondary electrons drawn out of the recess by the electric field reach the detector without being attracted by the electrode. By adopting this construction, a contact hole of high aspect ratio formed in a semiconductor device and having a small diameter and a large depth can be observed.

32 Claims, 15 Drawing Sheets $$\text{ASPECT RATIO} = \frac{l}{\left(\frac{\phi_1 + \phi_2}{2}\right)}$$

ELECTRON BEAM APPARATUS

BACKGROUND OF THE INVENTION

The present invention relates to an electron beam apparatus, for example, a scanning electron microscope which is suitable for performing observation or length measurement of a contact hole or a line pattern by irradiating an electron beam on a specimen, such as a semiconductor device, in order to evaluate a semiconductor production process.

The scanning electron microscope has hitherto been used for observation or length measurement of a contact hole or a line pattern of the submicron order (less than 1 $\mu$m) in a semiconductor device specimen.

With recent advancement in semiconductor integrated circuit technology, there has been a tendency for a circuit element to be formed in three-dimensional directions, so that, for example, contact holes and deep holes and grooves (hereinafter represented by contact holes) for separation of condensers and elements are formed in the specimen surface.

Incidentally, when an electron beam is irradiated on the interior of a contact hole for the purpose of observing the bottom of the contact hole, most of the secondary electrons discharged from the bottom of the contact hole impinge on the side wall of the contact hole, are captured thereby, and are thus prevented from escaping from the contact hole. Accordingly, the contact hole is considered to be equivalent to a Faraday cup.

As an approach to a method of detecting secondary electrons in a contact hole with high efficiency, a technique is proposed in, for example, JP-A-62-97246 according to which an electrode for drawing out secondary electrons from the contact hole is provided between an objective lens and the specimen surface to generate a positive electric field near the specimen surface so that and secondary electrons will be drawn out by the positive electric field.

Also, JP-A-63-274049 proposes a technique according to which a cylindrical electrode disposed in a pole piece of an objective lens is supplied with a positive voltage to generate a positive electric field near the specimen surface in order that secondary electrons generated in the specimen surface are drawn out efficiently and guided to the side, facing an electron source, of an objective lens. The present inventors have attempted to observe a contact hole by using an apparatus having the construction described in the above literature, but have failed to obtain an excellent image. In other words, the inside of the contact hole could not be observed.

SUMMARY OF THE INVENTION

An object of this invention is to provide an electron beam apparatus which can permit observation of the inside of even a contact hole having a high aspect ratio (depth/opening diameter).

Another object of the invention is to provide an electron beam apparatus which can permit observation of the inside of a contact hole without affecting the material in which the hole is formed (for example, a semiconductor device).

Still another object of the invention is to provide an electron beam apparatus which can automatically set an observation condition meeting for observation of a contact hole having a high aspect ratio and an observation condition for observation of another portion, i.e, a substantially flat portion, of a substrate.

According to the invention, an electron beam apparatus capable of attaining at least one of the above objects comprises an electrode for applying to a specimen an electric field which is sufficient to draw out secondary electrons from a contact hole and a unit for generating a magnetic field which focuses the secondary electrons drawn out of the contact hole.

Secondary electrons referred to herein signify electrons discharged from the specimen surface (inclusive of the inner peripheral surface and bottom surface of a contact hole) under irradiation of an electron beam (primary electron beam) which are characteristic of the specimen and captured by a secondary electron detector.

Positive voltage relative to the specimen is applied to the electrode. In order to draw out secondary electrons from the inside of a contact hole, a positive voltage higher than that applied to the electrode provided in the conventional example (JP-A-63-274049) of apparatus for observation of the specimen surface is applied to the electrode of the invention. In an embodiment, a voltage which makes the potential on the electrode 50 to 350 V higher than the potential on the specimen is applied to the electrode.

With the high potential applied to the electrode, an electric field developed between the electrode and a secondary electron detector disposed above the electrode (on the side facing the electron gun) becomes excessively strong and secondary electrons cannot sometimes be captured sufficiently. In such an event, a second electrode is interposed between the detector and the first electrode in order to adjust the intensity of the electric field therebetween. More particularly, by making the potential on the second electrode lower than that on the first electrode, the intensity of an electric field near the secondary electron detector can be adjusted.

The location of the first electrode is not particularly specified, but from the standpoint of realization of compactness of the apparatus and a high imaging magnification, the first electrode may preferably be arranged in a hole of a pole piece of the objective lens. To obtain a high imaging magnification, the distance between the objective lens and the specimen is required to be short.

Secondary electrons drawn out of the contact hole by the action of the electric field due to the electrode are focused by a magnetic field. Through this, the secondary electrons can be prevented from being adsorbed to the electrode. In the absence of the magnetic field, most of the secondary electrons are attracted by the electrode which is at high potential and a satisfactory image cannot be formed. Under the influence of the magnetic field, secondary electrons drawn out of the contact hole are focused while moving with helical motion as in a cyclotron. In order for the secondary electrons drawn out of the contact hole to be guided to the secondary electron detector without being attracted by the electrode, the flux density of the magnetic field must be sufficiently large on the specimen surface, i.e., at the outlet of the contact hole.

In an embodiment, the flux density on the specimen surface is set to about 5,000 gauses.

It is preferable to use the objective lens as a unit for generating the magnetic field from the viewpoint of reducing the number of parts. A an example of an objective lens capable of making flux density on the specimen surface sufficiently large, a so-called lower pole piece open type having a lower pole piece has a diameter larger than that of an upper pole piece may be employed. In this type of objective lens, the magnetic field leaks positively to a space beneath the lens. To meet the focusing requirements of an electron beam, the maximum flux density of the leakage magnetic flux occurs on a plane which substantially coincides with the specimen surface. Accordingly, the leakage magnetic flux has sufficient intensity to focus secondary electrons drawn out of the contact hole.

An electron beam apparatus having an objective lens of the lower pole piece open type has about 5 nm resolution.

In order to draw out secondary electrons from a contact hole having a high aspect ratio, it is preferable to charge the specimen surface at a peripheral edge of the contact hole in addition to the application of an electric field generated by the electrode. With the surface charged negatively (hereinafter simply referred to as charge-up), upward motion of secondary electrons in the contact hole is disturbed by the negative charge on the hole peripheral edge. For charging the specimen surface positively, the electron beam irradiation amount per unit area is an important factor.

The electron beam irradiation amount IQ is given by the following equation (1):

$$IQ = (M^2 \times Ip \times t)/S \qquad (1)$$

where
M: observation imaging magnification
Ip: probe current
t: imaging time (= irradiation time)
S: CRT scanning area.

Since the CRT scanning area is determined by the size of the CRT, the denominator is constant. Accordingly, given that the probe current Ip and the imaging time (= irradiation time) t are fixed, the electron beam irradiation amount IQ is proportional to a square of imaging magnification M.

Charge-up on the specimen surface is conditioned depending on the compositions of the electrical conductor and electrical insulator however, according to experiments conducted by the present inventors, it has been proved that even when charge-up takes place at an imaging magnification MO for desired observation to prevent satisfactory observation, a clear observation image of high S/N ratio can be obtained without charge-up for a while by irradiating an electron beam at an imaging magnification which is first reduced to a lower imaging magnification ML and thereafter irradiating an electron beam at an imaging magnification which is returned to the imaging magnification MO for desired observation.

This phenomenon can be understood by considering that even with the probe current Ip kept fixed, the electron beam irradiation area is widened at the low imaging magnification ML to substantially decrease the electron beam irradiation amount per unit area, thereby charging the specimen surface positively, and because of this preceding positive charge on the specimen surface, even when the imaging magnification is subsequently reduced to the imaging magnification MO at which negative charging is liable to occur, a charge balance is set up temporarily during an interval of time that the positively charged state changes to the negatively charged state.

Accordingly, by storing an observation image obtained during the period for disappearance of charge-up in an image memory or by photographing the observation image to leave a record thereof, a clear observation image of high S/N ratio can be obtained.

Further, according to experiments conducted by the present inventors, it has been proved that, conversely to the above, even when satisfactory observation cannot be permitted because of charge-up at the imaging magnification MO for a desired observation, charge-up can be put away for a while and a clear observation image of high S/N ratio can be obtained by irradiating an electron beam on a part of a predetermined observation area at an imaging magnification which is first raised to an imaging magnification MH higher than the imaging magnification MO and thereafter observation is effected at an imaging magnification which is returned to the imaging magnification MO.

This phenomenon cannot be explained by the above interpretation, but presumably, contamination generated during irradiation at the high imaging magnification MH is adhered to the specimen surface to degrade the insulation capability of the specimen surface, and therefore even when the imaging magnification is subsequently returned to the imaging magnification MO at which the specimen surface is liable to be charged negatively, charging hardly takes place.

Accordingly, as described above, by irradiating an electron beam for a predetermined time at an imaging magnification ML which is lower than an imaging magnification MO originally used for desired observation or at an imaging magnification MH higher than the imaging magnification MO and thereafter returning imaging magnification to the original imaging magnification MO for desired observation, an excellent observation image can be obtained.

In addition to an electron beam, other charged particle beams, such as an ion beam, can also be used provided that this charged particle beam is effective to generate secondary electrons from a specimen.

BRIEF DESCRIPTION OF THE DRAWINGS

These and other objects and technical advantages of the present invention will be readily apparent from the following description of the preferred exemplary embodiments of the invention in conjunction with the accompanying drawings, in which.

DESCRIPTION OF THE PREFERRED EMBODIMENTS

Figure 1:
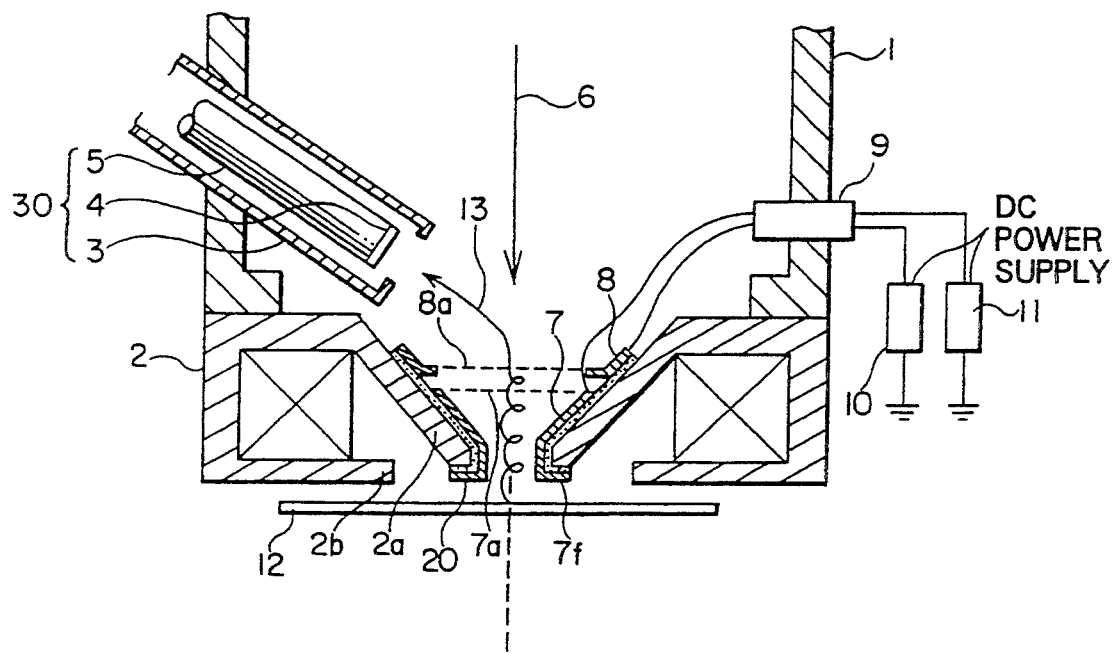
FIG. 1 is a partial sectional view of an embodiment of an electron beam length-measuring apparatus according to the invention.

FIG. 1 is a sectional view showing the proximity of objective lens 2 and secondary electron detector 30 in an embodiment of an electron beam length-measuring apparatus according to the invention.

An electron beam 6 is focused on a specimen 12 by means of the objective lens 2. The objective lens 2 is of a lower pole piece open type in which the hole diameter of the lower pole piece 2b is larger than that of an upper pole piece 2a in order that leakage flux of the objective lens 2 exhibits the maximum magnetic flux density on the surface of the specimen 12. By using this type of objective lens, a short focus lens can be obtained as in the case of an in-lens system in which the specimen 12 is otherwise disposed in a lens gap, ensuring that the spherical aberration coefficient and chromatic aberration coefficient can be decreased remarkably and a high resolution can be obtained.

As this objective lens was used an objective lens (type: S-6100) incorporated in an electron beam length-measuring apparatus manufactured by Hitachi, Ltd.

Mounted on the upper pole piece 2a of the objective lens 2 through an insulating film 20 is a first electrode 7 having a cylindrical form and which passes along the inner wall of the opening of the upper pole piece and has an end flange 7f opposing the specimen, thus forming an inner electron beam passage.

An upper opening of the first electrode 7 is covered with a grid mesh 7a for drawing out secondary electrons 13 toward the detector 30. The grid mesh 7a is formed at its center with an opening which does not disturb a deflection path of electron beam 6. The first electrode 7 is connected to a DC power supply 10 through an inlet terminal 9.

A second electrode 8 having a ring form is disposed above the first electrode 7 and as in the case of the first electrode 7, its lower opening is covered with a grid mesh 8a having a central opening. The second electrode 8 is connected to a DC power supply 11 through the inlet terminal 9.

Disposed above the second electrode 8, that is, on the side of objective lens 2 facing the electron beam source is the secondary electron detector 30 comprised of a ground electrode 3, a scintillator 4 and a light guide 5. The scintillator 4 is supplied with a high voltage of +10 kV to accelerate secondary electrons.

Figure 2:
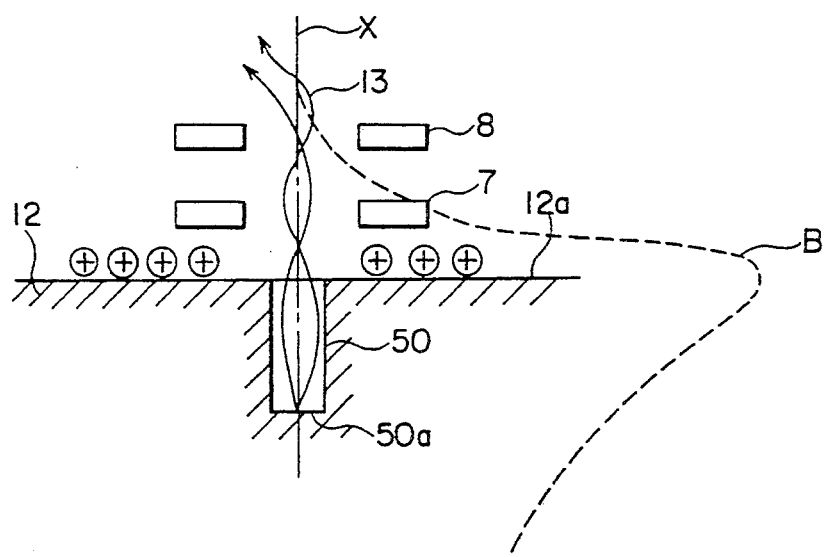
FIG. 2 is a diagram illustrating diagrammatically the motion of secondary electrons in the FIG. 1 apparatus.

The objective lens 2 and the first and second electrodes 7 and 8 interact with each other to cause secondary electrons to be passed through the pole piece opening of the objective lens 2 and then to be drawn out toward the electron source (toward the detector 30), the behavior of the secondary electrons being illustrated schematically in FIG. 2 in which the same reference numerals as those in FIG. 1 designate identical or equivalent parts.

Since the objective lens 2 in the present embodiment is of the lower pole piece open type as described previously in order that a leakage magnetic field of the objective lens 2 exhibits a maximum flux density on a surface 12a of the specimen, a magnetic field B as shown at the dotted curve in FIG. 2 is generated near the observation area and this magnetic field B exhibits the function of a lens having a center plane (lens plane) near the specimen surface 12a.

With the above construction, an electron beam is irradiated on the specimen 12 to discharge secondary electrons from a specimen surface portion near an opening of a contact hole 50 and the secondary electrons are drawn upwards by an electric field generated by the first electrode 7. At that time, in the present embodiment, the secondary electrons are focused on central axis X by the lens action created by the objective lens 2 so as to be drawn upwards without being drawn toward the first electrode 7. The secondary electrons are further guided toward the side of objective lens facing the electron beam source by the action of electric fields generated by the first and second electrodes 7 and 8.

On the other hand, secondary electrons 13 discharged from the bottom surface 50a of the contact hole 50 are drawn upwards by the electric field due to the first electrode 7 so as to escape from the contact hole 50. The secondary electrons 13 leaving the contact hole are focused on the central axis X by the lens action due to the objective lens 2 so as to be drawn upwards without being drawn toward positive charges on the specimen surface.

As a result, the secondary electrons 13 discharged from the specimen 12 are drawn up toward the side of the objective lens 2 facing the electron source through the electron beam passage of first electrode 7 and the opening of grid mesh 7a and are detected by the detector 30.

In accordance with the present embodiment, secondary electrons discharged from the proximity of the opening of the contact hole 50 or secondary electrons generated from the bottom 50a of the contact hole and escaping from the contact hole are focused on the central axis by the focusing magnetic field generated on the specimen surface by the objective lens, so that they are guided toward the side of objective lens facing the electron beam source without being drawn toward the first electrode 7 or captured by positive charges on the specimen surface. Accordingly, the detector 30 can detect the secondary electrons with high efficiency.

Further, the efficient draw-up of secondary electrons prevents charge-up of the specimen surface to promote efficient draw-up of, especially, secondary electrons 13 discharged from the bottom 50a of contact hole 50 to permit high-resolution observation of the contact hole bottom.

Figure 3A:
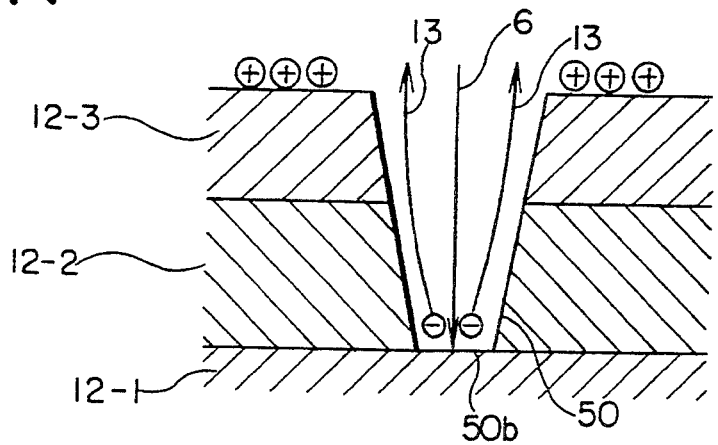
FIGS. 3A and 3B are sectional views showing an example of the structure of a specimen.
Figure 3B:
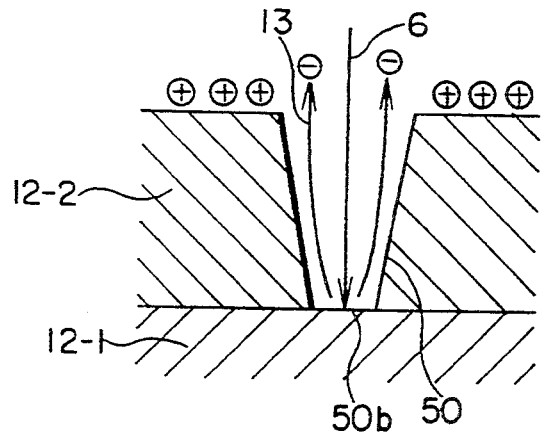

FIG. 3A is a sectional view of a specimen representing an object to be measured by the electron beam length-measuring apparatus according to the present embodiment. Formed on the major surface of a silicon substrate 12-1 is a silicon dioxide film 12-2 on which a resist film 12-3 is laminated. When the coated resist film 12-3 is exposed to light or to an electron beam and is developed, an exposure pattern is formed at the resist portion. Further, an etching treatment is applied to etch off an unnecessary portion of the silicon dioxide film 12-2, thus forming a hole 50 reaching the silicon substrate 12-1. The resist film 12-3 of FIG. 3A is then removed as shown in FIG. 3B.

Figure 4:
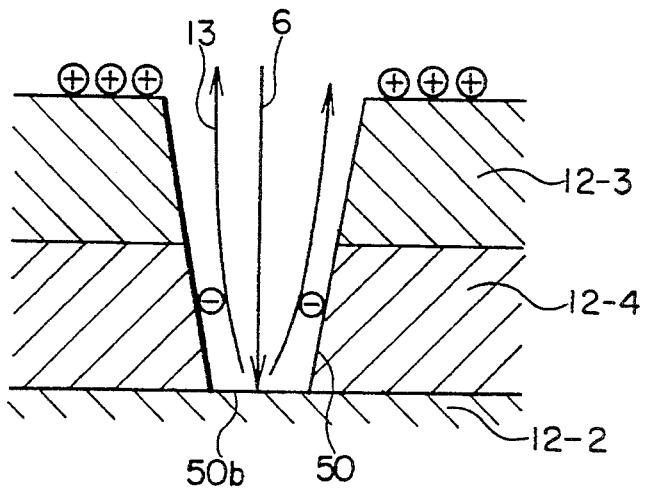
FIG. 4 is a sectional view showing another example of the structure of a specimen.

FIG. 4 is a Sectional view of another specimen representing an object to be measured by the electron beam length-measuring apparatus according to the present embodiment and the same reference numerals as those used hereinbefore designate identical or equivalent parts.

As shown in the sectional view of FIG. 4, a silicon oxide film 12-2 is formed on a silicon substrate, an aluminum thin film 12-4 is vapor deposited on the film 12-2 to form a conductive film, and a resist material 12-3 is coated thereon and exposed to light, thus forming a contact hole reaching the silicon oxide film 12-2.

When an electron beam 6 is irradiated on a specimen having a laminar structure formed of a conductor and an insulator as described above, secondary electrons 13 are generated from the bottom of the contact hole. At that time, secondary electrons are also generated from the surface of specimen 12 and in the case where the number of discharged secondary electrons is larger than the number of incident electrons of the electron beam 6, the specimen surface is charged positively. According to results of experiments conducted by the present inventors, the specimen surface is charged positively under the condition that the accelerating voltage is set to 1 kV or less and the electron beam amount is set to $10^{-11}$ A or less.

It has been proved experimentally that if the accelerating voltage is set to more than 1 kV to charge the surface of the resist film 12-3 negatively, secondary electrons from the bottom 50a are prevented from escaping by the negative potential on the surface and cannot be detected at all.

According to the present embodiment, since the charging state on the surface of resist film 12-3 or silicon dioxide film 12-2 can be kept to be positive, secondary electrons 13 generated from the contact hole bottom are allowed to escape from the contact hole with highly frequency.

The positively charged specimen surface can be determined by observing a desired observation area at enlargement of, for example, about 50000 multiple and thereafter observing a wider area inclusive of the desired observation area by reducing the imaging magnification to, for example, about 5000 multiple to confirm that the area observed previously at 50000 multiple is darker as a whole than its neighborhood.

This is based on the fact that, if the specimen surface is charged positively, most of secondary electrons discharged from the specimen surface are attracted by a positive potential to reduce the detection amount of the secondary electrons.

Whether or not the desired observation area is darker than its neighborhood may be determined either by the operator who consults a CRT (cathode ray tube) or on the basis of a detection signal from the secondary electron detector 30. When a decision is made based on the detection signal from the secondary electron detector 30, whether or not the specimen surface is charged positively may be announced to the operator by using suitable means such as a display or alarm.

After the fact that the desired observation area is charged positively has been confirmed, the imaging magnification is again returned to 50000 multiple and an observation is carried out. If a negatively charged state is confirmed, the observation area may be charged to positive by using suitable means and an observation may follow.

Through experiments, it has been proved that; when a voltage amounting to 50 V or more is applied to the first electrode 7, effective results can be obtained, though depending on the values of the accelerating voltage for electron beam 6, and that no difference occurs for 300 V to 350 V.

By applying a voltage falling within the range between ground potential and +50 V to the second electrode 8, secondary electrons from the bottom 50a of the contact hole could be detected without degrading the secondary electron detection efficiency.

In practical use, the voltage applied to the second electrode 8 may be fixed to about 30 V for various specimens. With the second electrode 8 supplied with a negative voltage, the secondary electron signal is reduced as a whole, but only secondary electrons and reflection electrons of higher energy can be detected, thereby making it possible to detect signals of relatively high energy reflected from the hole bottom or a deep groove. Accordingly, signals from the bottom grow relatively and an image satisfactory for observation of the bottom can be obtained.

An excellent image could be obtained by scanning the electron beam at a rate of 10 or more frames/second but during scanning at such a low rate as 1 frame/second, the electron beam irradiation amount per unit area was increased to substantially increase the electron beam amount, so that the specimen surface was charged negatively to prevent observation of the hole bottom.

Conceivably, this fact is due to a phenomenon that the charging state on the specimen surface is kept positive uniformly at an electron beam scanning area by high-rate scanning, and the necessity of high-rate scanning for observation of the interior of the contact hole was confirmed experimentally. In a practical apparatus, 30 frames/second matching the scanning television frequency is chosen to ensure a scanning synchronous with the power supply frequency and to meet economical requirements.

As detailed above, in accordance with the present embodiment, a secondary electron signal generated from the bottom of a contact hole or of a deep groove can be detected efficiently during a semiconductor production process and an excellent image can be obtained which is sufficiently effective for quality examination of semiconductor process working.

Specifically, in accordance with the present embodiment, the bottom of a fine, deep hole formed above the silicon substrate and having a hole bottom diameter of 0.45 μm, an upper opening diameter of 0.9 μm and a depth of 1.9 μm could be observed.

Figure 5:
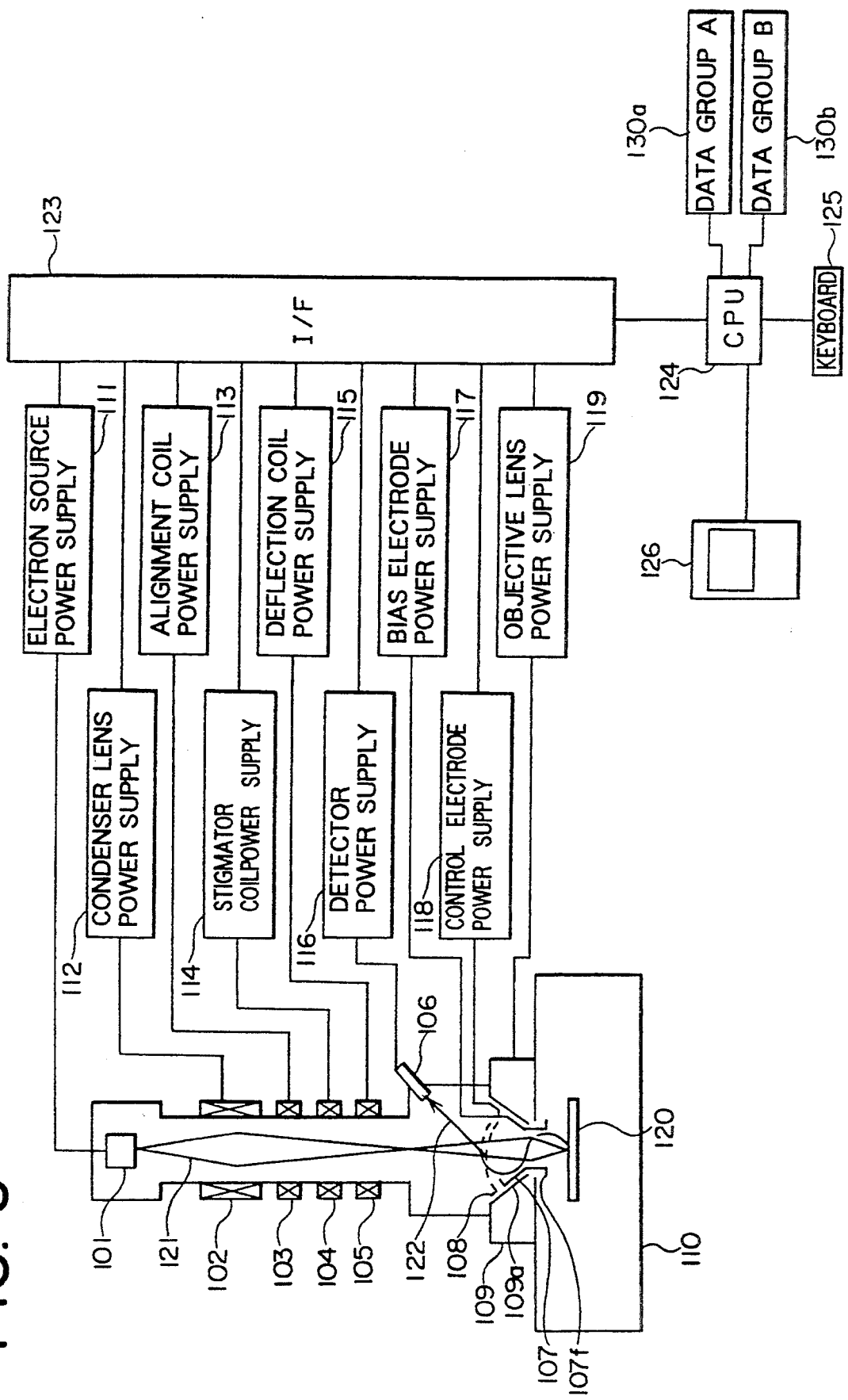
FIG. 5 is a block diagram showing the construction of an embodiment of a scanning electron microscope according to the invention.

FIG. 5 is a block diagram showing the overall construction of an embodiment of a scanning electron microscope according to the invention. A practical apparatus comprises evacuation means for vacuum evacuating the apparatus interior space used as an electron beam passage, but only components necessary to describe the invention are illustrated in FIG. 5.

An electron beam 121 emitted from an electron source 101 is focused by a condenser lens 102 and subjected to optical alignment by an alignment coil 103. A stigmator coil 104 corrects an astigmatic aberration of the electron beam 121 and a deflection coil 105 deflects and scans the electron beam 121.

Mounted on an upper pole piece 109a of an objective lens 109 is a bias electrode 107 having a cylindrical form and which passes along the inner wall of an opening of the upper pole piece and has an end flange 107f opposing a specimen, thus forming an inner electron beam passage.

An upper opening of the bias electrode 107 is covered with a grid mesh (not shown) for drawing out secondary electrons 122 toward a detector 106. The grid mesh is formed at its center with an opening which does not disturb a deflection path of electron beam 121.

A control electrode 108 having a ring form is disposed above the bias electrode 107 and as in the case of the bias electrode 107, its lower opening is covered with a grid mesh (not shown) having a central opening.

Electron beam 121 having passed through the control electrode 108 and bias electrode 107 is focused by the objective lens 109 and irradiated on a specimen 120 placed in a specimen chamber 110. Secondary electrons 122 generated from the specimen 120 are detected by the detector 106.

The electron source 101 is connected to an electron source power supply 111, the condenser lens 102 to a condenser lens power supply 112, the alignment coil 103 to an alignment coil power supply 113, the stigmator coil 104 to a stigmator coil power supply 114, the deflection coil 105 to a deflection coil power supply 115, the bias electrode 107 to a bias electrode power supply 117, the control electrode 108 to a control electrode power supply 118 and the objective lens 109 to an objective lens power supply 119. The detector 106 is connected to a detector power supply 116 and the detector power supply 116 performs supply of power to the detector 106 and intermediation of a detection signal from the detector 106.

The above-described power supplies are controlled by signals from a central processing unit (CPU) 124 through an interface (I/F) 123. Various kinds of data are inputted to the central processing unit 124 from a keyboard 125. A detection signal from the detector 106 is sent to the central processing unit 124 through the interface 123 and displayed as an image on image display means 126.

Connected to the central processing unit 124 are memories 130a and 130b in which the following data are stored in advance.

(1) Data group A: control data being used when output voltages of the bias electrode power supply 117 and control electrode power supply 118 are both 0 (zero) V and consisting of:
 (a) coil current supplied to the alignment coil 103;
 (b) coil current supplied to the stigmator coil 104; and
 (c) coil current supplied to the deflection coil 105 at a desired imaging magnification.

(2) Data group B: control data being used when output voltages of the bias electrode power supply 117 and control electrode power supply 118 are predetermined voltages V1 and V2 and consisting of:
 (a) coil current supplied to the alignment coil 103;
 (b) coil current supplied to the stigmator coil 104;
 (c) coil current supplied to the deflection coil 105 at a desired imaging magnification;
 (d) DC current to be superposed on deflection coil current so as to correct an image shift;
 (e) an increment of lens current supplied to the objective lens 109; and
 (f) a change of background level necessary for correcting image data.

Since control data portions registered in data group A and delivered to the individual power supplies are different for different values of imaging magnification, the control data portions delivered to the individual power supplies are registered in a data table format using magnifications as parameters.

Since control data portions registered in data group B and delivered to the individual power supplies are different for different values of imaging magnification and voltages V1 and V2, the control data portions delivered to the individual power supplies are registered in a data table format using magnifications and voltages V1 and V2 as parameters.

With the above construction, when observation of an ordinary pattern is conducted, output voltages of the bias electrode power supply 117 and control electrode power supply 118 are set to 0 (zero) V. The central processing unit 124 selects the data group A to control the individual power supplies in accordance with data portions in the data group A.

When observation of the inside of a contact hole is conducted, output voltages of the bias electrode power supply 117 and control electrode power supply 118 are set to voltage V1 (for example, +300 V) and V2 (for example, +30 V), respectively. The central processing unit 124 selects the data group B to control the individual power supplies in accordance with data portions in the data group B.

According to the present embodiment, control data of individual components necessary for obtaining the best scanning image is automatically selected in accordance with whether or not a positive electric field is generated on the specimen surface, and therefore the operational capability can be improved drastically.

While in the foregoing embodiment the bias electrode 107 and control electrode 108 are both described as being supplied with voltages to generate a positive electric field on the specimen surface, the present invention is not limited thereto and a voltage may be supplied to only the bias electrode 107, with the control electrode 108 being always grounded (0V).

In this case, the effective range over which the electric field generated by bias electrode 107 affects the electron beam 121 is substantially cancelled by the control electrode 108, and hence there is no need of registering in the data group B control data concerning a coil current necessary for the alignment coil 103 (aforementioned (a)) and an additional DC current superposed on deflection coil current for correction of an image shift (aforementioned (d)).

Figure 6:
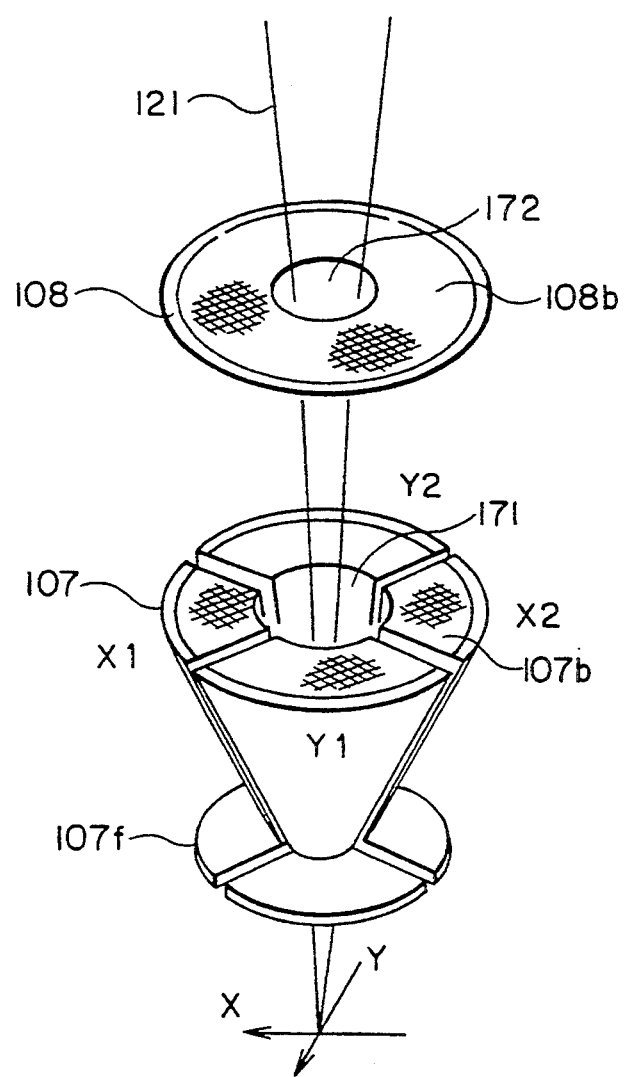
FIG. 6 is a perspective view showing another embodiment of a bias electrode.

FIG. 6 is a diagram showing another example of the construction of the bias electrode 107 and in the figure, the same reference numerals as those in the foregoing designate identical or equivalent parts.

This embodiment features a bias electrode 107 which is divided into four divisional electrodes (x1, X2, Y1 and Y2) in the direction of the optical axis of the electron beam so that positive electric fields generated by the divisional electrodes X1, X2, Y1 and Y2 may be different from each other.

Electrodes 107 and 108 are formed, at their central portions, with holes 171 and 172 for passage of an electron beam 121, respectively, and the passage holes 171 and 172 are surrounded by meshes 107b and 108b to permit secondary electrons to pass therethrough.

In the present embodiment, the bias electrode 107 is described as being divided into four segments, but the invention is not limited thereto, since the electrode may be divided into two or six segments.

According to the present embodiment, voltages applied to the plurality of divisional electrodes can be controlled independently and, therefore, by adjusting the relative relation between voltages applied to the respective divisional electrodes and the absolute values of the voltages, alignment (aforementioned (a)) and image shift correction (aforementioned (b)) which are otherwise set in the data group B can be omitted.

Figure 7:
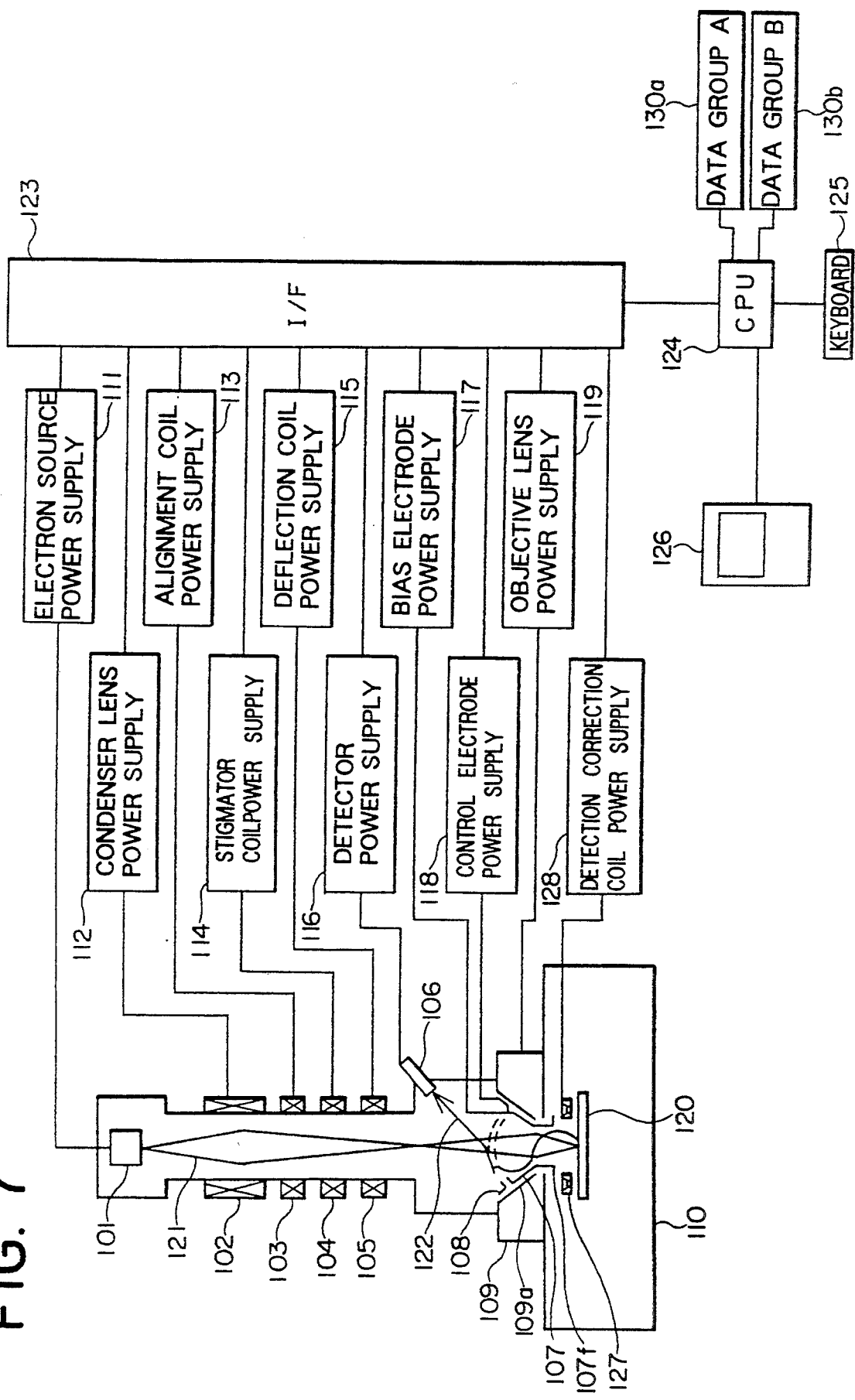
FIG. 7 is a block diagram showing another embodiment of the scanning electron microscope according to the invention.

FIG. 7 is a block diagram showing the construction of another embodiment of the scanning electron microscope according to the invention, and in the figure, the same reference numerals as those in the foregoing designate identical or equivalent parts.

The present embodiment features the addition of a deflection correction coil 127 and a deflection correction coil power supply 128 to the construction explained in connection with FIG. 5.

The deflection correction coil power supply 128 is connected to an interface 123 and its output current is controlled by a central processing unit 124. The central processing unit 124 is initially registered with control data concerning the amount and direction of deflection of an electron beam necessary for correcting an image shift and a misalignment, which take place when positive voltages are applied to the bias electrode 107 and control electrode 108.

With this construction, when no positive voltage is applied to the bias electrode 107 and control electrode 108, the output current of the deflection correction coil power supply 128 is also set to zero.

When positive voltages are applied to the bias electrode 107 and control electrode 108, the deflection correction coil power supply 128 is controlled such that currents for correction of the image shift and misalignment are supplied on the basis of the control data.

According to the present embodiment, correction of alignment and image shift which is otherwise effected using data portions set in the data group (aforementioned (a) and (b)) can be performed using the dedicated correction coil 127, and therefore the amount of control data can be reduced.

As described above, according to the present embodiment, control data of individual components necessary for obtaining a scanning image is selected automatically in accordance with whether or not a positive electric field is generated on the specimen surface and operational capability can be improved drastically.

Figure 8:
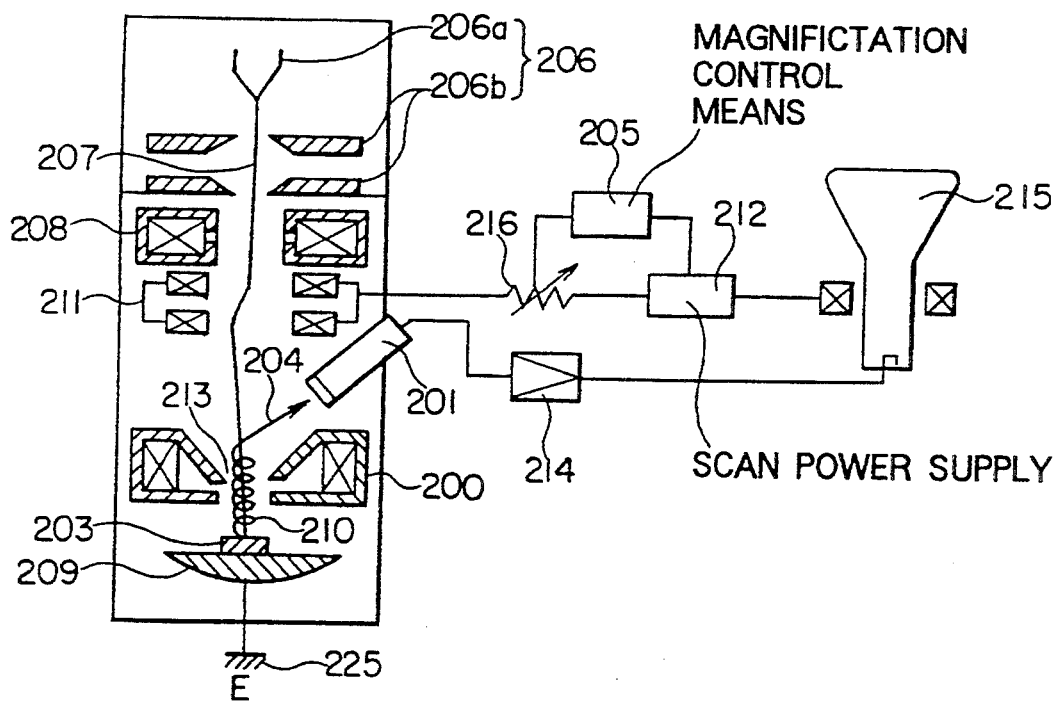
FIG. 8 is a schematic diagram showing another embodiment of the scanning electron microscope according to the invention.

FIG. 8 is a schematic diagram showing still another embodiment of the scanning electron microscope (SEM) according to the invention. Illustrated therein is a SEM of the TTL (through the lens) type in which secondary electrons 204 generated from a specimen 203 and having passed through an objective lens pole piece hole 213 are detected by a secondary electron detector 201 disposed above the objective lens 200.

In the figure, an electron beam 207 emitted from a field emission type electron gun 206 comprised of a field emission cathode 206a and an electrostatic lens 206b is focused to a very fine electron probe 210 on the surface of the specimen 203 carried on a specimen stage 209 by means of a condenser lens 208 and the objective lens 200. The electron probe 210 is scanned on the specimen surface by deflecting the electron beam 207 by means of a deflection coil 211 energized by a scan power supply 212.

Secondary electrons 204 generated from the specimen surface by scanning the electron probe 210 are captured by an objective lens magnetic field so as to pass through the pole piece hole 213 and are then guided to the secondary electron detector 201. A detection signal from the secondary electron detector 201 is amplified by an amplifier circuit 214 and sent as a video signal to a cathode ray tube (hereinafter abbreviated as CRT) 215.

Imaging magnification of an image to be observed is adjusted by changing the scanning width of the electron probe 210 on the specimen surface by means of a magnification changing circuit 216 to adjust the ratio between this scanning width and the screen width on the CRT. Magnification control means 205 controls the magnification changing circuit 216 and scan power supply 212 such that the electron beam is irradiated on the specimen surface for a predetermined time at a lower imaging magnification (ML) or a higher imaging magnification (MH) than an imaging magnification (MO) for desired observation and thereafter the imaging magnification is returned to the imaging magnification (MO) for desired ordinary observation.

In place of the control by the magnification control means 205, an imaging magnification and irradiation time (timer) may be set manually by the operator for a specimen which is liable to charge up or may be set by selecting a menu initially incorporated in a software program.

Figure 15:
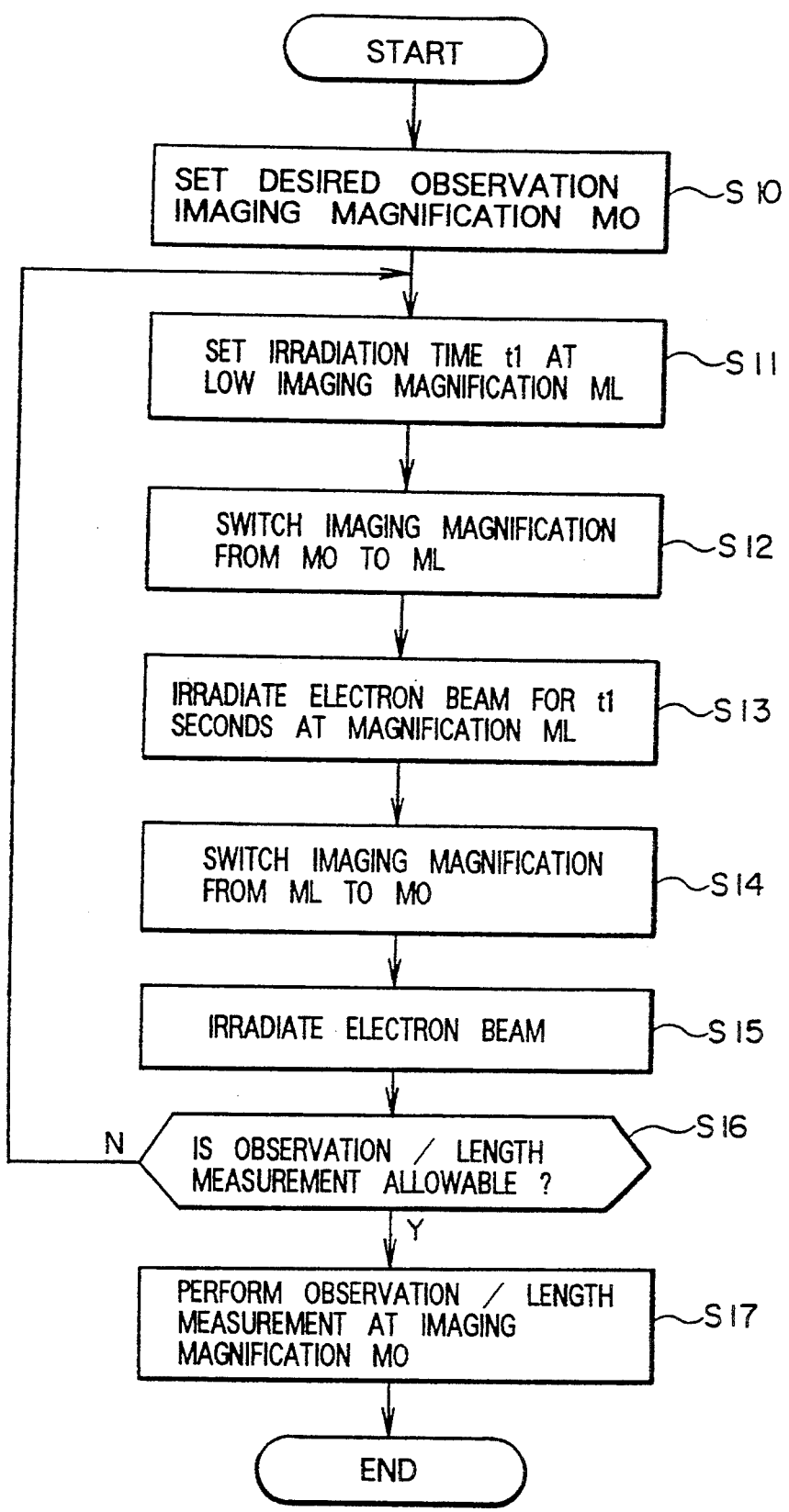
FIG. 15 is a flow chart for explaining an operation of the apparatus of the embodiments.

FIG. 15 is a flow chart for explaining an observation method used by the SEM constructed as above.

In step S10, a desired observation imaging magnification MO is set. In step S11, an irradiation time t1 at a low imaging magnification ML is set. In step S12, the magnification changing circuit 216 changes the scanning width of the electron probe 210 on the specimen surface so as to switch the imaging magnification from observation imaging magnification MO to low imaging magnification ML.

In step S13, the electron beam is irradiated for the aforementioned irradiation time t1 at the imaging magnification ML, and thereafter in step S14, the imaging magnification is switched by the magnification control means 215 from low imaging magnification ML to observation imaging magnification MO. In step S15, the electron beam is irradiated on the specimen.

In step 16, the operator confirms an observation image by referring to the CRT. If an observation or length measurement is allowable, the program proceeds to step S17 where an observation or length measurement is carried out, but if an observation or length measurement is difficult to perform, the program returns to step S11 and the previous processings are repeated.

Figure 16:
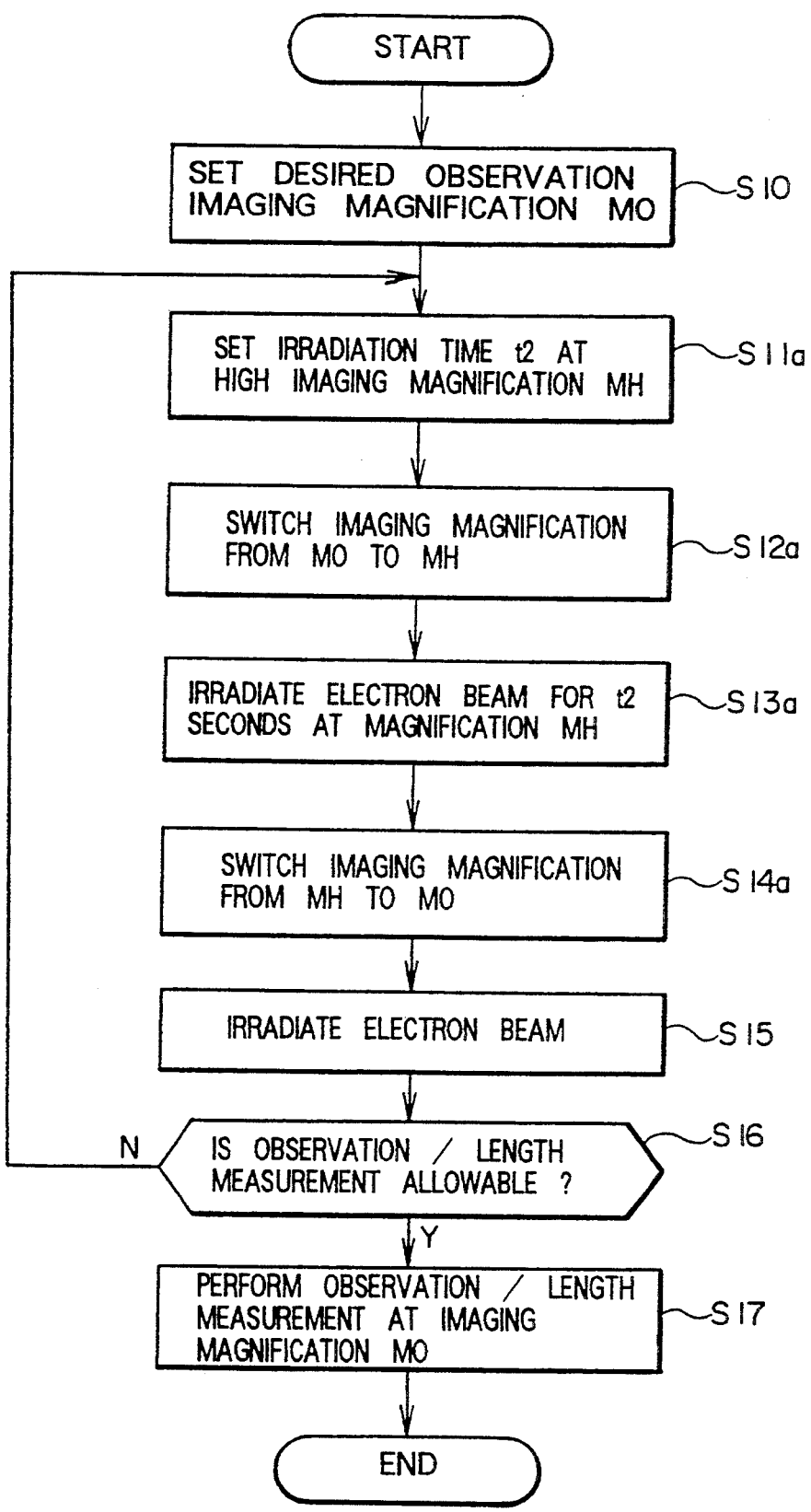
FIG. 16 is a flow chart for explaining another operation of the apparatus of the embodiments.

FIG. 16 is a flow chart showing another observation method, and in steps assigned with the same reference numerals as those in the foregoing description, equivalent processings are executed which will not be described herein.

In step S11a, irradiation time t2 at a high imaging magnification MH is set. In step 12a, the magnification changing circuit 216 changes the scanning width of the electron probe 210 on the specimen surface to switch the imaging magnification from observation magnification MO to high magnification MH.

In step 13a, the electron beam is irradiated for the aforementioned irradiation time t2 at the imaging magnification MH, and thereafter in step 14a, the imaging magnification is switched from high magnification MH to observation magnification MO.

Figure 17:
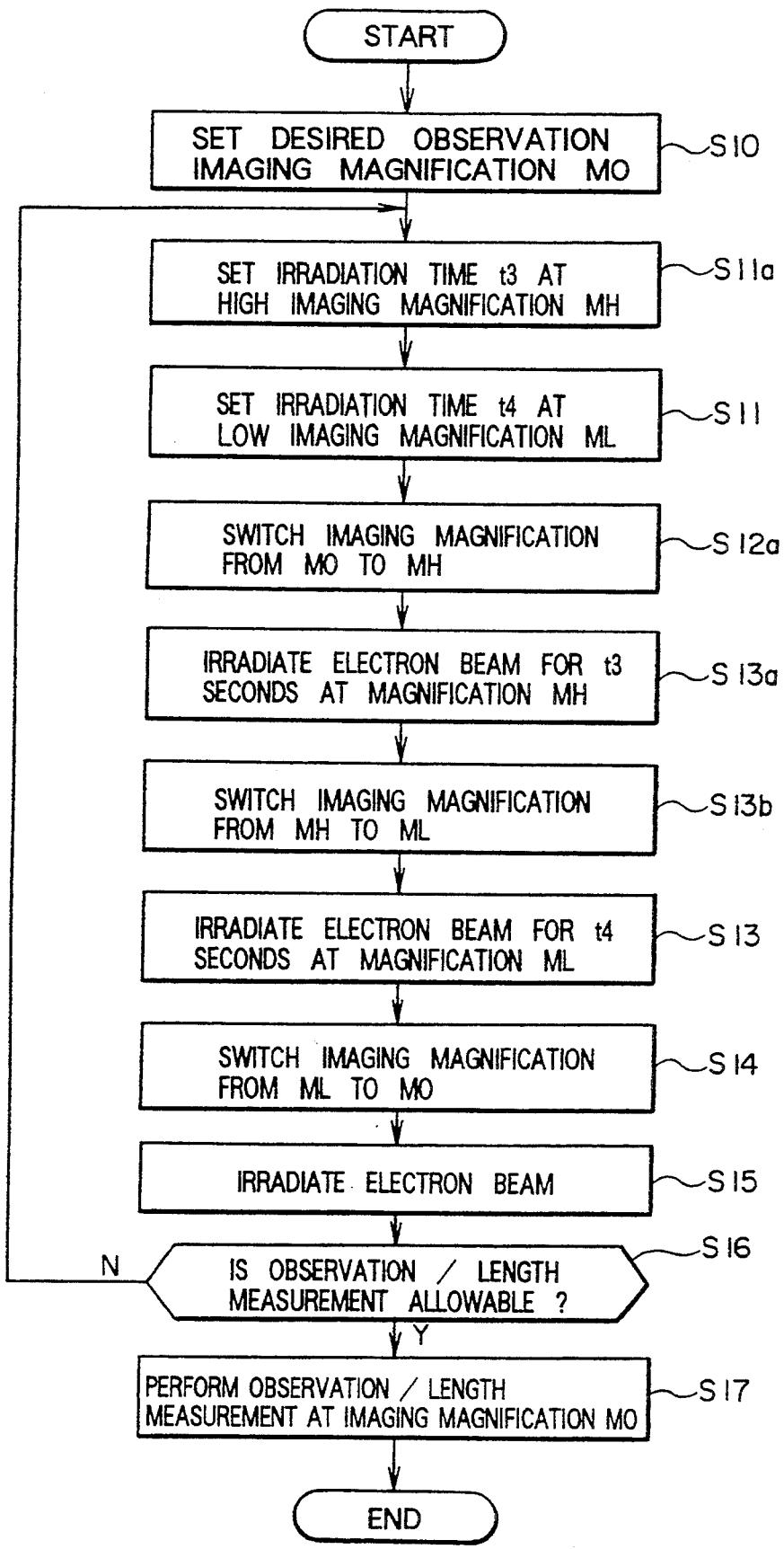
FIG. 17 is a flow chart for explaining still another operation of the apparatus of the embodiments.

FIG. 17 is a flow chart showing still another observation method and in steps assigned with the same reference numerals as those in the foregoing, equivalent processings are executed which will not be described herein.

In the present embodiment, the electron beam is initially irradiated for time t3 at a high magnification MH, then the imaging magnification is switched to a low magnification ML at which the electron beam is irradiated for time t4, and thereafter the imaging magnification is returned to an observation magnification MO at which observation or length measurement is carried out.

In each observation mode described above, observation of a scanning image may be either allowable or unallowable during the irradiation periods for low magnification ML and high magnification MH. Practically, the low magnification is preferably set to ML=MO/50 to MO/100 and the high magnification MH is preferably set to MH≧3 MO.

Figure 9:
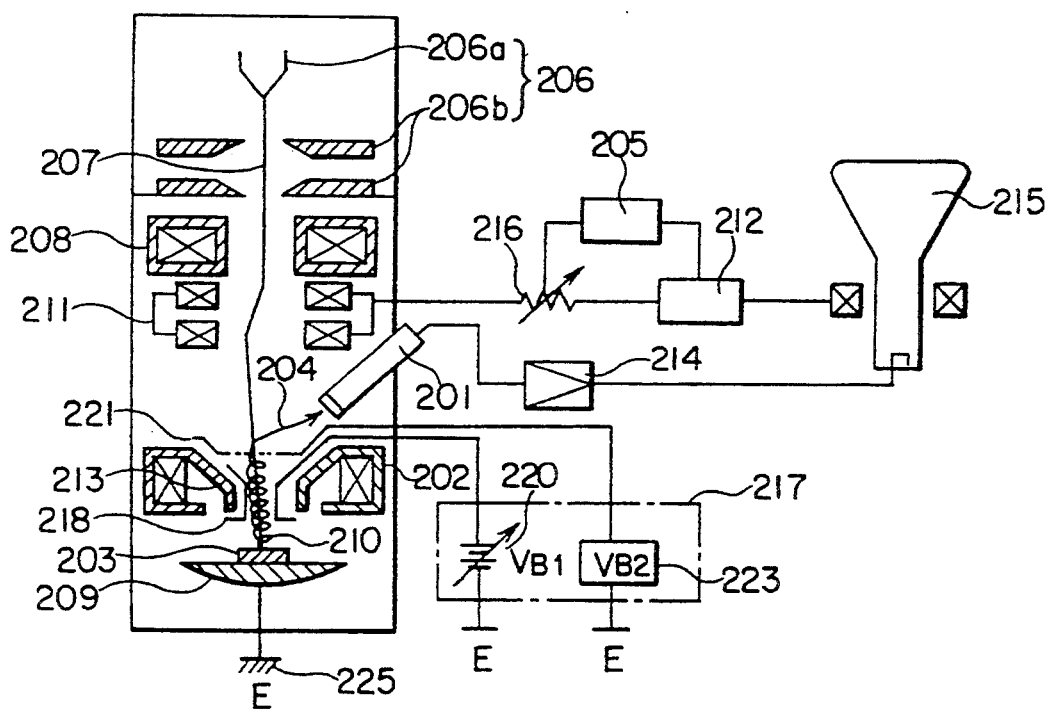
FIG. 9 is a schematic diagram showing still another embodiment of the scanning electron microscope according to the invention.

FIG. 9 is a schematic diagram of a further embodiment of the SEM according to the invention, and in the figure, the same reference numerals as those in the foregoing description designate identical or equivalent parts.

The present embodiment has the feature that, in order to apply an electric field to the specimen 1 surface to draw out secondary electrons 204 generated from a deep groove, such as a contact hole, and guide them to a secondary electron detector 201 efficiently, an electric field control electrode 218, an energy control electrode 221 and electric field control means 217 for controlling these control electrodes are provided. An objective lens 202 generates a magnetic field to focus the secondary electrons extracted from the deep hole.

Figure 10:
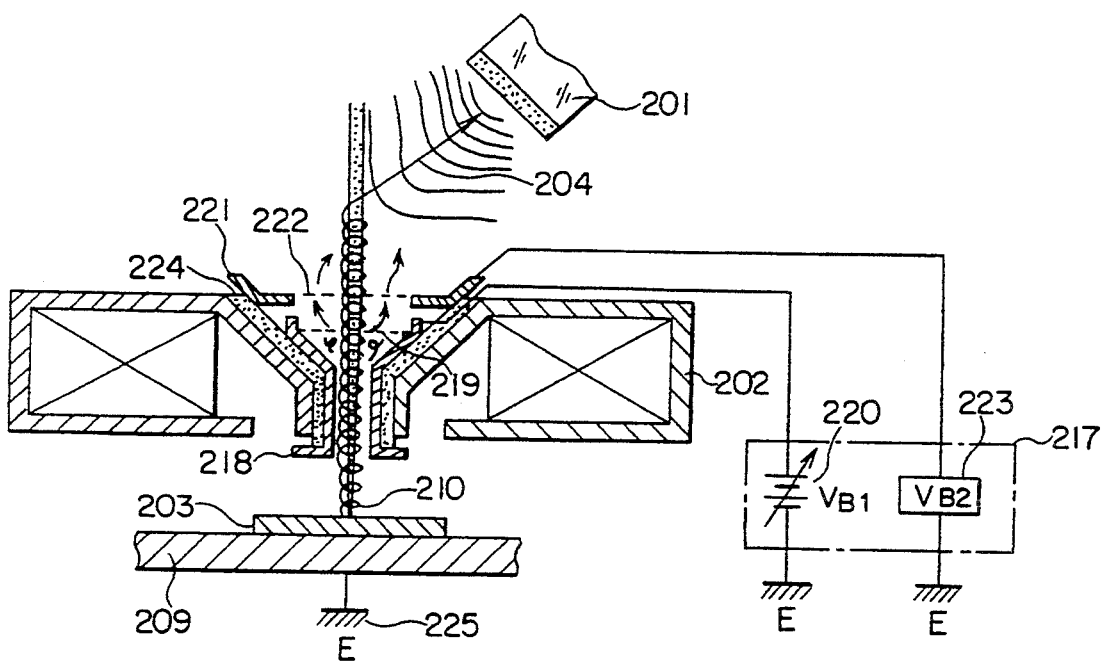
FIG. 10 is a fragmentary enlarged view of FIG. 9.

FIG. 10 is a sectional view useful to explain the electric field control electrode 218 and energy control electrode 221 in detail.

The electric field control electrode 218 is mounted concentrically with a pole piece hole 213 of an objective lens 202 to oppose the specimen 203. Mounted above the electric field control electrode 218 is a planar mesh 219 having an electron beam passage hole.

The mesh 219 is not always needed, but it functions to average the kinetic energy of the secondary electrons which are drawn up in an oblique direction at an angle to the center axis. The mesh 219 may have a semispherical form.

The electric field control electrode 218 is supplied with electric field control voltage (VB1) 220 from outside of the vacuum. The control voltage VB1 is set to a value which is lower than the accelerating voltage of the primary electron beam 207 and is of a positive potential relative to the specimen 203. Practically, the value may preferably amount up to 100 to 350 V.

Disposed above the electric field control electrode 218 is the second control electrode (energy control electrode) 221. This electrode plays the role of selecting electrons which have passed through the electric field control electrode 218 (secondary electrons and reflection electrons) in accordance with their kinetic energy and of guiding selected ones to the secondary electron detector 201 with high efficiency.

The energy control electrode 221 also has an electron beam passage hole having an optical axis (center axis) in common with the objective lens and a planar (or semispherical) mesh 222. The energy control electrode 221 is applied with energy control voltage (VB2) 223 from the outside of vacuum. The value of control voltage VB2 is variable within a range of −20 to +40 V in order to permit discrimination of energy between the secondary electron and the reflection electron. The two control electrodes 218 and 221 are electrically insulated from ground 225 by an insulator 224.

In accordance with the present embodiment, secondary electrons generated from the specimen 203 are positively drawn up by an electric field due to the control voltage VB1, caused to pass through the electric field control electrode 218 while tracing a helical locus under the influence of an objective lens magnetic field, and then subjected to energy discrimination by the energy control electrode 221 so as to be guided to the secondary electron detector 201 with high efficiency.

Figure 11:
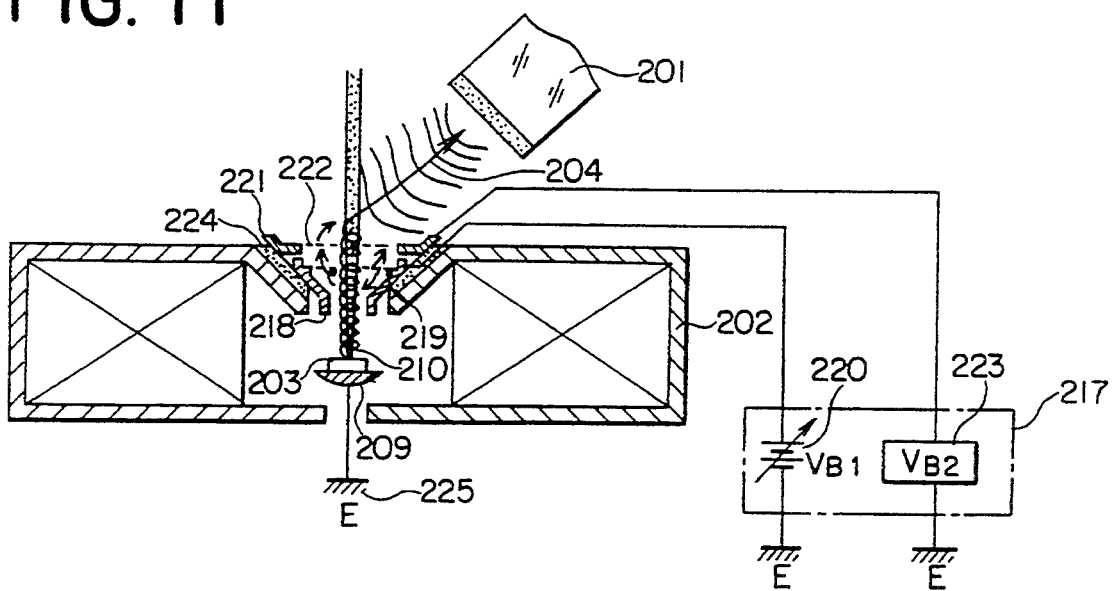
FIG. 11 is a schematic diagram showing still another embodiment of the scanning electron microscope according to the invention.

FIG. 11 shows an embodiment wherein the aforementioned control electrodes 218 and 221 are arranged in a so-called in-lens system scanning electron microscope in which a specimen 203 is placed in a pole piece gap of an objective lens 202. In the present embodiment, similar effects to those described previously can also be attained.

Figure 14:
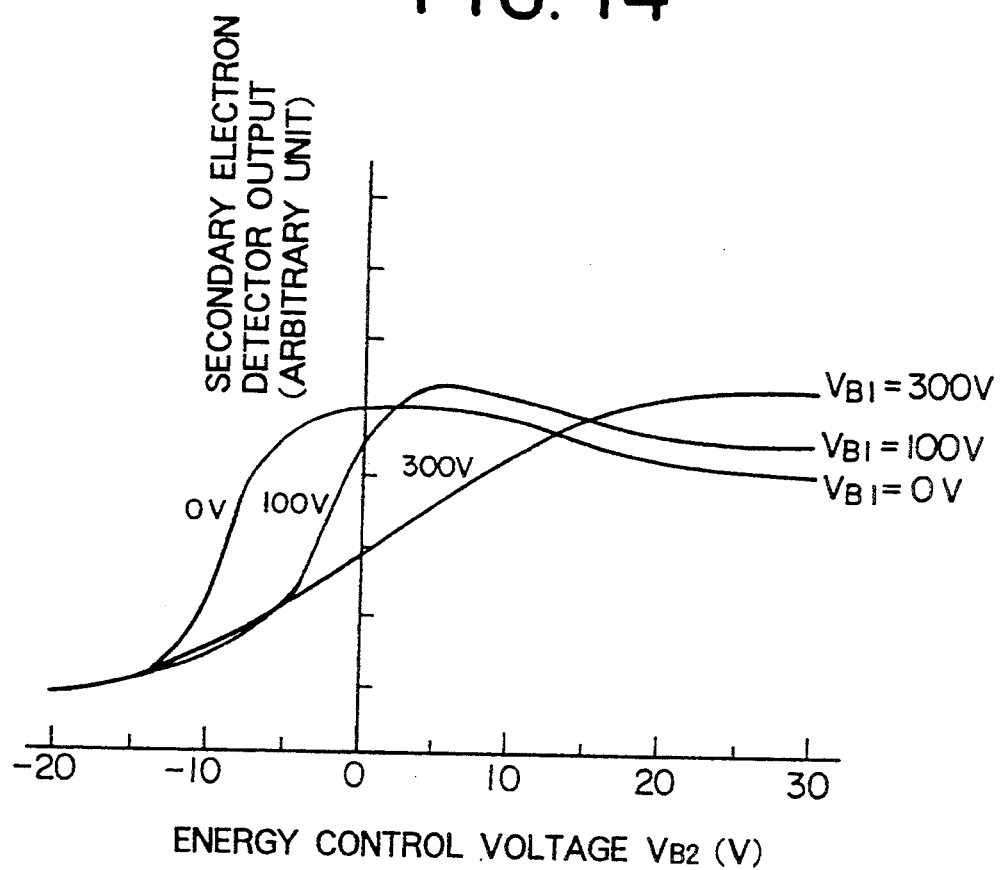
FIG. 14 is a graph showing the relation between the output of a secondary electron detector and an energy control voltage.

When a probe current Ip of 4pA is applied at an accelerating voltage of 700 V to a photoresist surface of a semiconductor device specimen by using the construction explained in connection with FIG. 10, results of measurement are obtained to provide the relation between the control voltage VB2 and the secondary electron detector output with the control voltage VB1 used as parameter, as exemplified in FIG. 14.

It will be appreciated that as the control voltage VB1 increases at an imaging magnification of 1,000 multiple, the peak of the secondary electron detector output shifts toward the positive side of control voltage VB2, indicating that potential on the specimen surface can be controlled and the charge can be balanced more easily under the application of control voltage VB1 than without the application thereof.

Results of experiments conducted by the present inventors have demonstrated that when a deep hole having an aspect ratio of 3 or more, which is formed in the contact hole surface of a semiconductor device comprised of $SiO_2$ and photoresist and formed on a Si substrate, is observed with the SEM described in connection with FIG. 9 under the condition that the imaging magnification MO is 50,000 multiple, the imaging magnification ML is 1,000 multiple, the imaging magnification MH is 150,000 multiple and the probe current Ip is 3pA, the shape and size of the hole bottom can be observed clearly.

Figure 12:
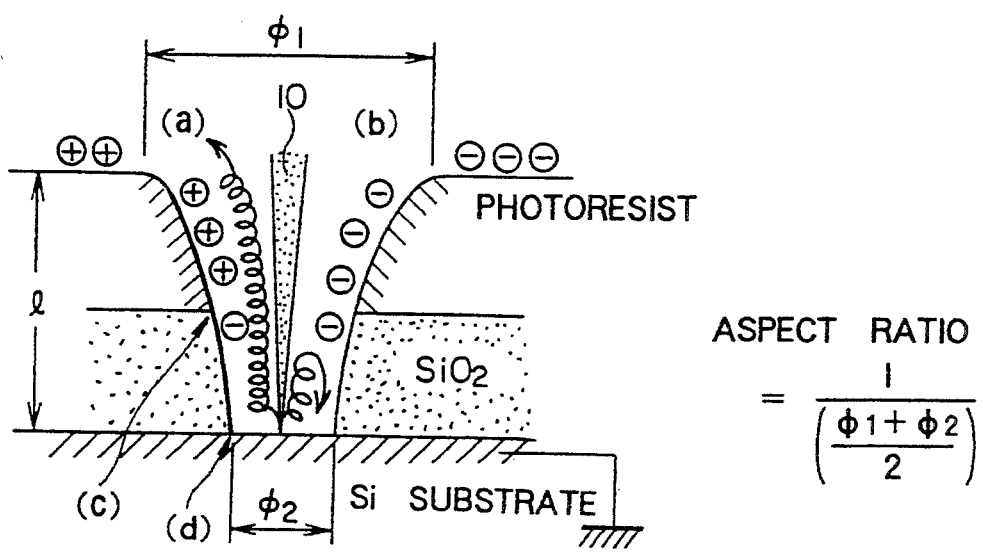
FIG. 12 is a diagram for explaining the behavior of a charge in a contact hole.

This specimen has a sectional shape, for example, as shown in FIG. 12. With the conventional technique, a trench portion (b) of the photoresist is charged negatively and secondary electrons generated from the $SiO_2$ and Si underlying the photoresist are shielded by a strong negative field at the trench portion and are prevented from leaving a hole upwards, with the result that observation of contours (d) and (c) of the $SiO_2$ and Si cannot be attained. In other words, measurement of the hole bottom size and recognition of residues at the hole bottom become impossible.

In contrast, when, as in the present embodiment, the observation methods described with reference to the flow charts of FIGS. 15 to 17 are employed and control voltages VB1 and VB2 are applied, charge balance occurs as shown at a trench portion (a) to ensure that secondary electrons generated from $SiO_2$ and Si can be detected with high efficiency efficiently and an observation image of high contrast can be obtained.

Without the employment of the observation method according to the present embodiment, an irradiation current (electron beam irradiation amount IQ) per unit area increases at the imaging magnification (MO) for ordinary desired observation to disturb the charge balance, so that acquisition of secondary electrons from the hole bottom cannot be attained and contrast is lost.

If the observation imaging magnification (MO) is lowered to obtain high contrast, the hole diameter observable on the CRT is reduced. For example, a hole diameter of 0.5 $\mu$m is observed as being about 12.5 mm at the most at an imaging magnification of 25,000 multiple, making it difficult to observe the hole bottom precisely.

Figure 13:
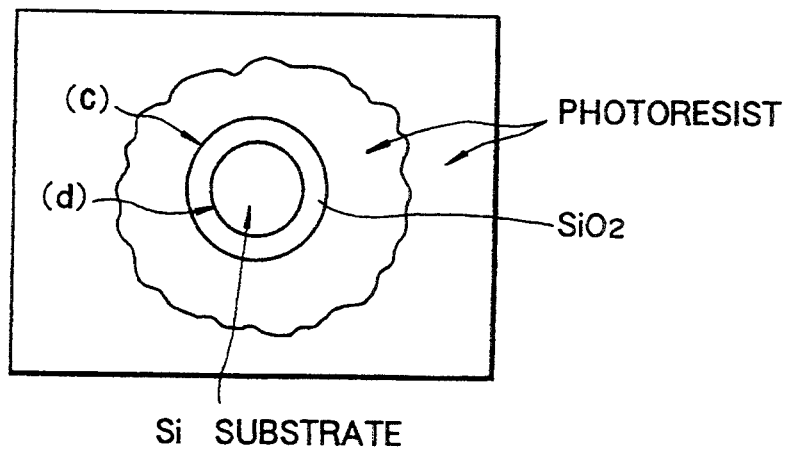
FIG. 13 is a diagram showing an image obtained with the apparatus of the embodiments.

With the present invention applied, however, contrast at boundary portions (d) and (c) of $SiO_2$ and Si can be obtained for a predetermined time as shown in FIG. 13. Experiments conducted by the present inventors have proved that by the employment of this observation method, the imaging magnification (MO) usable for ordinary desired observation can be increased twice or more.

Figure 18:
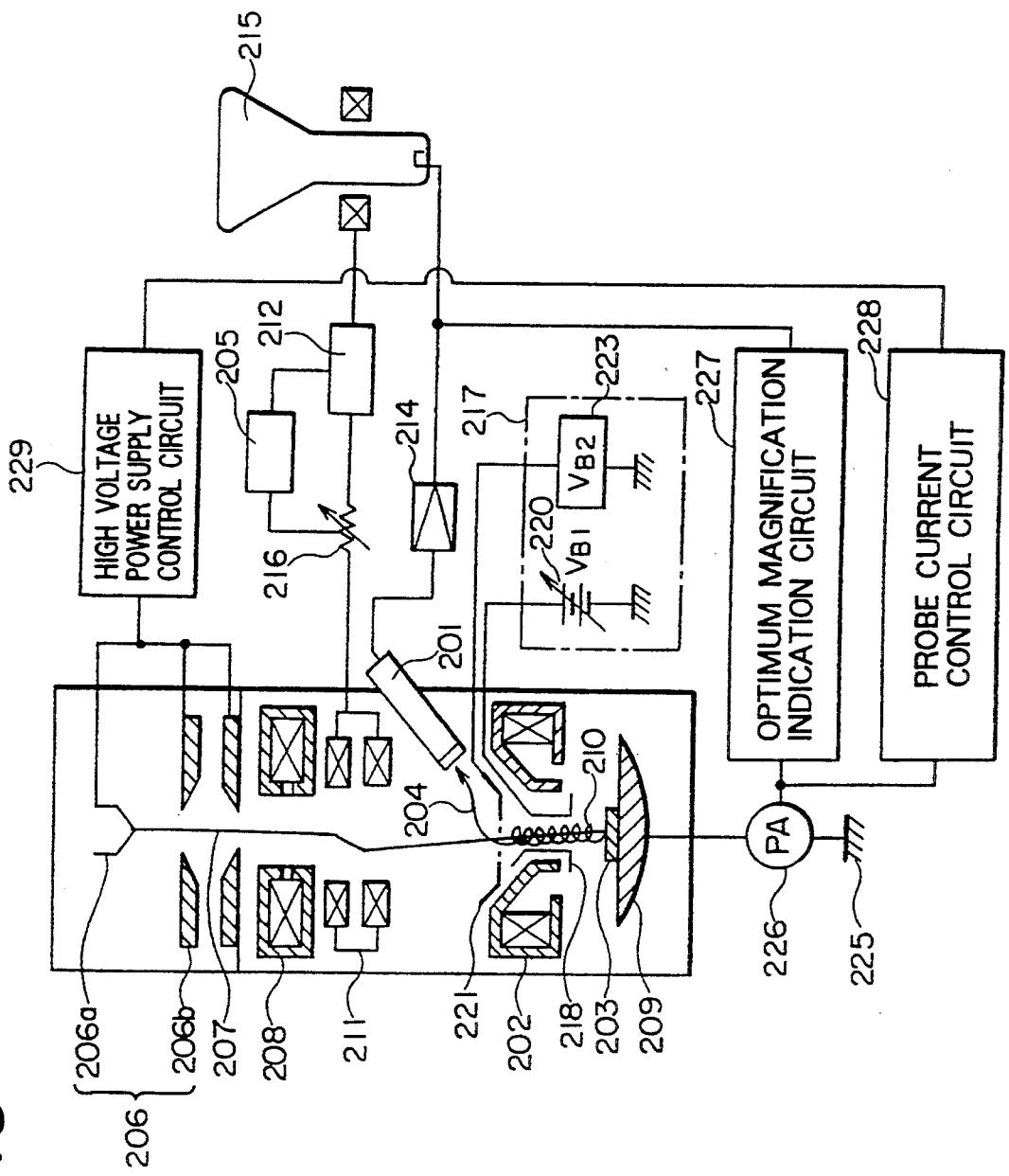
FIG. 18 is a schematic diagram showing a further embodiment of the scanning electron microscope according to the invention.

FIG. 18 is a schematic diagram showing a further embodiment of the SEM according to the invention, and in the figure, the same reference numerals as those in the foregoing designate identical or equivalent parts.

The present embodiment features the provision of a probe current detection circuit 226 for detecting probe current, an optimum magnification indication circuit 227 responsive to a value of detected probe current to indicate a magnification range in which charge-up is not likely, to occur and a probe current control circuit 228 for controlling the probe current value such that charge-up hardly occurs at a designated imaging magnification.

The present embodiment takes advantage of the fact that charge-up on the specimen surface depends on the electron beam irradiation amount IQ and the probe current detection circuit 226 can be designed as, for example, a Faraday cup provided at a part of a specimen stage 209 to permit measurement of a current value of the order of 1 $\mu$A to 0.5 pA from the outside of the vacuum.

The optimum magnification indication circuit 227 displays on an operation panel (not shown ) or a CRT 215 an analog or digital indication representative of a range of enlargement magnification optimum for a detected probe current. Alternatively, it may be so designed as to respond to a menu programmed in advance to indicate probe currents and magnifications which are optimum for various kinds of specimens.

The probe current control circuit 228 is used when the probe current is changed to comply with an imaging magnification MO for practical desired observation and upon actuation of an operation button (not shown), it performs control such that a high voltage power supply control circuit 229 for an electron gun 206 is operated to change the amount of the electron beam 207 so as to obtain a necessary probe current.

According to the present embodiment, a probe current which is not likely to cause charge-up can be acquired steadily to permit a clear observation image to be produced, and besides it can be utilized to decide the conditions of specimen damage and electron optics.

Figure 19:
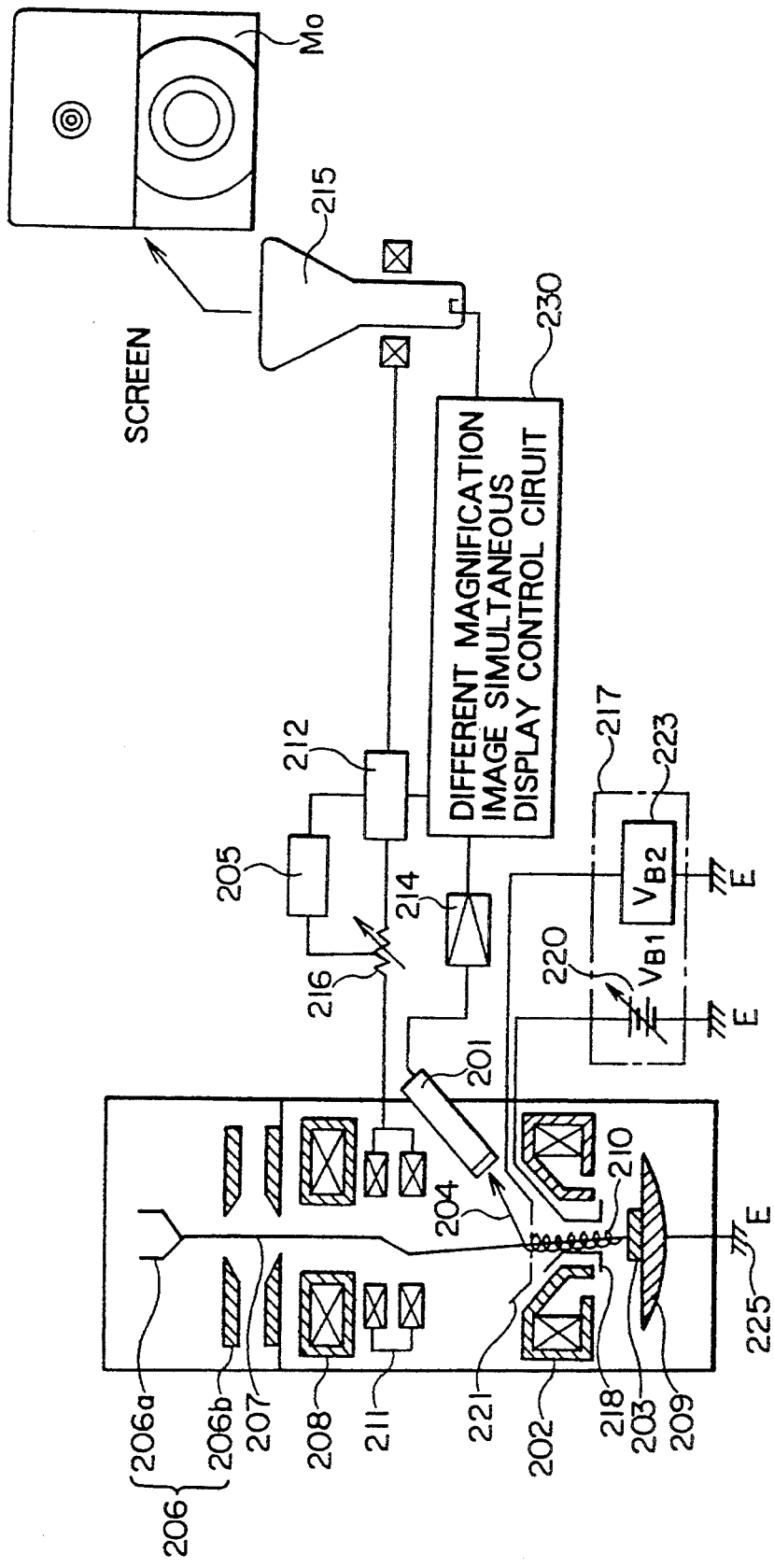
FIG. 19 is a schematic diagram showing a still further embodiment of the scanning electron microscope according to the invention.

FIG. 19 is a schematic diagram showing a still further embodiment of the SEM according to the invention, and in the figure the same reference numerals as those in the foregoing designate identical or equivalent parts.

The present embodiment features the provision of a different magnification image simultaneous display control circuit 230 for displaying images at different imaging magnifications on the same CRT 215 simultaneously. Instead of displaying images on the same CRT, images at different imaging magnifications may be displayed simultaneously on a plurality of CRTs.

The principle of the performance of the different magnification image simultaneous display control circuit 230 is described in, for example, Japanese Patent Publication No. 46-24459, Japanese Patent Publication No. 52-20819 or Japanese Patent Publication No. 51-36150 which are incorporated herein by reference.

As is clear from the basic concept of the present invention described previously, according to the present embodiment, the specimen surface is charged positively by scanning for low imaging magnification observation and negatively by scanning for high imaging magnification observation and therefore observation can always be effected under a charge-balanced condition.

Figure 20:
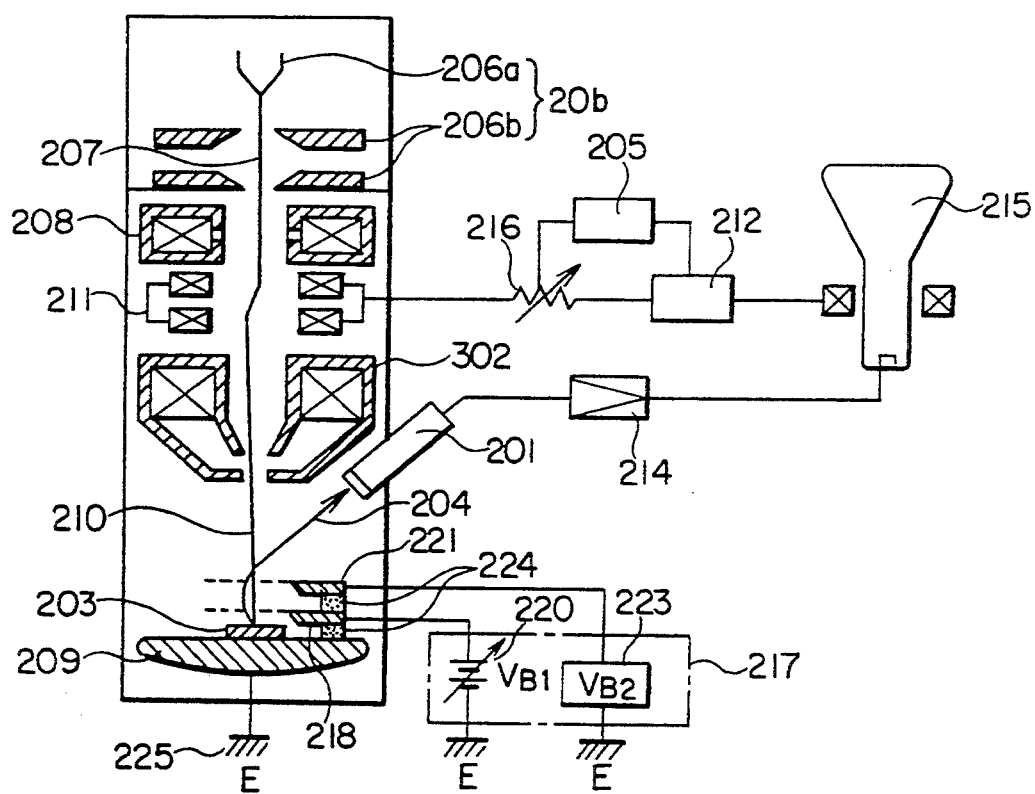
FIG. 20 is a schematic diagram showing a still further embodiment of the scanning electron microscope according to the invention.

FIG. 20 is a schematic diagram showing a still further embodiment of the SEM according to the invention, and in the figure the same reference numerals as those in the foregoing designate identical or equivalent parts.

The present embodiment features the provision of control electrodes 218 and 221 described in connection with FIGS. 9 and 10 in a so-called out-lens system SEM having a secondary electron detector 201 disposed under an objective lens 302.

The electric field control electrode 218 and energy control electrode 221 are mounted to a specimen stage 209 through an insulator 224. The present embodiment has an advantage that the intensity of an electric field applied to the specimen surface does not change even when the working distance and the inclination angle of the specimen stage are changed.

The present invention is in no way limited to the embodiments of FIGS. 8 to 20 set forth so far and it can attain similar effects even when applied to a scanning electron microscope in which the electron detector is constructed of an annular type detector or a channel plate detector which is arranged directly above the specimen or objective lens concentrically with the optical axis.

As described above, according to the embodiments of FIGS. 8 to 20, the following meritorious effects can be attained.

(1) By irradiating an electron beam on the specimen surface for a predetermined time at a lower or higher imaging magnification than a desired observation imaging magnification and thereafter returning the imaging magnification to the desired observation imaging magnification and irradiating an electron beam, a charge balance can be set up temporarily and this period can be utilized for image observation to produce an observation image of high resolution at a high imaging magnification.

(2) By applying an electric field to the specimen surface, secondary electrons generated from the specimen surface under the electron beam irradiation can be guided efficiently to the secondary electron detector to produce a scanning image of high S/N ratio.

(3) Since the relative relation between a probe current which is not likely to cause charge-up on the specimen surface and the imaging magnification is determined in order that a probe current complying with a desired observation imaging magnification or an observation imaging magnification complying with a desired probe current can be obtained easily, optimum observation conditions complying with the specimen, imaging magnification and probe current can be obtained easily.

(4) By performing scanning for low imaging magnification and scanning for high imaging magnification simultaneously, observation can always be effected under a charge-balanced condition.

In addition to the foregoing description, the following will be disclosed.

(1) A scanning electron microscope for scanning an electron beam spot at an observation area on a specimen and fetching a signal generated secondarily from the observation area to produce an observation image, comprising:
 first imaging magnification setting means for setting a desired observation imaging magnification (MO);
 second imaging magnification setting means for setting at least one of an imaging magnification (ML) lower than the observation imaging magnification (MO) and an imaging magnification (MH) higher than the observation imaging magnification; and
 means for performing image observation in any one of first to third observation modes of which the first observation mode is such that an electron beam is irradiated for a predetermined time at the low imaging magnification (ML) and thereafter image observation is effected at the observation imaging magnification (MO); the second mode is such that an electron beam is irradiated for a predetermined time at the high imaging magnification (MH) and thereafter observation is effected at the observation imaging magnification (MO); and the third mode is such that an electron beam is irradiated for a predetermined time at one of the low imaging magnification (ML) and high imaging magnification (MH), then an electron beam is further irradiated for a predetermined time at the other imaging magnification and thereafter observation is effected at the observation imaging magnification (MO).

(2) A scanning electron microscope as recited in item 1 wherein an electrode is provided which has positive potential relative to the specimen and applies an electric field to the specimen surface.

(3) A scanning electron microscope as recited in item 1 or 2 comprising:
 means for detecting an electron beam amount irradiated on the specimen; and
 means for indicating a proper value range of observation imaging magnification in accordance with the detected electron beam amount.

(4) A scanning electron microscope as recited in item 1 or 2 further comprising:
 means for detecting an electron beam amount irradiated on the specimen; and control means for controlling the electron beam amount in accordance with an observation imaging magnification.

(5) A scanning electron microscope as recited in item 1 or 2 further comprising means for changing the scanning area of an electron beam alternately and displaying a low imaging magnification image and a high imaging magnification image simultaneously.

(6) An observation method in a scanning electron microscope for scanning an electron beam spot at an observation area on a specimen and fetching a signal generated secondarily from the observation area to produce an observation image, comprising irradiating a weak electron beam for a predetermined time on an area including at least a predetermined observation area and thereafter irradiating a strong electron beam on the predetermined observation area to perform image observation.

(7) An observation method in a scanning electron microscope for scanning an electron beam spot at an observation area on a specimen and fetching a signal generated secondarily from the observation area to produce an observation image, comprising irradiating a strong electron beam for a predetermined time on at least a part of a predetermined observation area and thereafter irradiating a weak electron beam on the predetermined observation area to perform image observation.

(8) An observation method in a scanning electron microscope for scanning an electron beam spot at an observation area on a specimen and fetching a signal generated secondarily from the observation area to produce an observation image, comprising irradiating an electron beam for a predetermined time on an area including a predetermined observation area at an imaging magnification (ML) lower than a desired observation imaging magnification (MO) and thereafter observing the desired observation area at the desired observation imaging magnification (MO).

(9) An observation method in a scanning electron microscope for scanning an electron beam spot at an observation area on a specimen and fetching a signal generated secondarily from the observation area to produce an observation image, comprising irradiating an electron beam for a predetermined time on a part of a predetermined observation area at an imaging magnification (MH) higher than a desired observation imaging magnification (MO) and thereafter observing the desired observation area at the desired observation imaging magnification.

(10) An observation method in a scanning electron microscope for scanning an electron beam spot at an observation area on a specimen and fetching a signal generated secondarily from the observation area to produce an observation image, comprising irradiating an electron beam for a predetermined time on an area including a predetermined observation area at an imaging magnification (ML) lower than a desired observation imaging magnification (MO), then irradiating an electron beam for a predetermined time on a part of the predetermined observation area at an imaging magnification (MH) higher than the desired observation imaging magnification and thereafter observing the desired observation area at the desired observation imaging magnification (MO).

(11) An observation method in a scanning electron microscope for scanning an electron beam spot at an observation area on a specimen and fetching a signal generated secondarily from the observation area to produce an observation image, comprising irradiating an electron beam for a predetermined time on a part of a predetermined observation area at an imaging magnification (MH) higher than a desired observation imaging magnification (MO), then irradiating an electron beam for a predetermined time on an area including the predetermined observation area at an imaging magnification (ML) lower than the desired observation imaging magnification (MO) and thereafter observing the desired observation area at the desired observation imaging magnification (MO).

Japanese Patent Applications Hei 3-335981, Hei 3-335985 and Hei 3-335986 are hereby incorporated by reference.

The present invention has been described in detail but it should be understood that various changes, substitutions and alternations can be made hereto without departing from the spirit and scope of the present invention as defined by the appended claims.

We claim:

1. A charged particle beam apparatus for observing a specimen having a recess in its surface, comprising:
   means for generating a charged particle beam;
   an objective lens for irradiating and focusing the beam on the surface of the specimen, the objective lens having an upper pole piece and lower pole piece, the lower pole piece delimiting a first hole and the upper pole piece delimiting a second hole, a size of the first hole being larger than a size of the second hole at least at opposing surfaces of the upper and lower pole pieces, so that the objective lens forms a magnetic field substantially focused on the surface of the specimen, the beam passing through the first and second holes of the lower and upper pole pieces of the objective lens;
   an electrode for generating an electric field on the surface of the specimen and by which, together with the magnetic field, cause electrons characteristic of the specimen which are discharged from the recess to be drawn out of the recess; and
   a detector for detecting the electrons.

2. An electron beam apparatus according to claim 1 wherein said objective lens is interposed between said detection means and said specimen, and said electrons leaving said recess reach said detection means through the first and second holes of said objective lens.

3. An electron beam apparatus according to claim 2 wherein said electrode is disposed on the peripheral wall of said pole piece hole concentrically therewith.

4. An electron beam apparatus according to claim 1 wherein resolution of said objective lens is about 5 nm.

5. An electron beam apparatus according to claim 1 further comprising a second electrode interposed between said electrode and said detection means and operable to adjust an electric field between said electrode and said detection means.

6. An electron beam apparatus according to claim 5 wherein said electrode is supplied with a voltage which is 50 to 350 V higher than the potential of said specimen and said second electrode is supplied with a voltage which is 0 to 50 V higher than the potential of said specimen.

7. An electron beam apparatus according to claim 1 wherein said electrode is supplied with a positive voltage relative to said specimen.

8. An apparatus according to claim 1, wherein said means for generating a charged particle beam generates an electron beam.

9. An apparatus according to claim 8, wherein said electrode is disposed on the peripheral wall of said upper pole piece of said objective lens concentrically with said second hole and on the side of said objective lens facing said electron beam generating means, said detector being interposed between said electrode and said electron beam generating means, and another electrode is interposed between said detector and said electrode for adjusting an electric field between said electrode and said detector.

10. An apparatus according to claim 8, wherein said upper pole piece of said objective lens faces the electron beam generating means, said electrode being disposed on the peripheral wall of said upper pole piece of said objective lens concentrically with the second hole, said detector being interposed between said electrode and said electron beam generating means, and another electrode being interposed between said detector and the electrode for adjusting an electric field between the electrode and the detector.

11. An apparatus according to claim 1, wherein a lower end of the upper pole piece is disposed within the first hole of the lower pole piece.

12. An apparatus according to claim 1, wherein the first hole of the lower pole piece and the second hole of the upper pole piece are arranged concentrically, and the upper pole piece is spaced from an inner surface of the first hole of the lower pole piece so as to delimit a gap, the objective lens forming the magnetic field having a maximum flux density substantially on the surface of the specimen.

13. A charged particle beam apparatus according to claim 12, wherein the means for generating a charged particle beam generates an electron beam.

14. A charged particle beam apparatus according to claim 1, wherein the first hole of the lower pole piece and the second hole of the upper pole piece are arranged concentrically, and the upper pole piece is spaced from an inner surface of the first hole of the lower pole piece so as to delimit a gap, wherein the magnetic field formed by the objective lens is leaked from the gap and has a substantially maximum intensity on the surface of the specimen.

15. A charged particle beam apparatus according to claim 1, wherein the first hole of the lower pole piece and the second hole of the upper pole piece are arranged concentrically, and the upper pole piece is spaced from an inner surface of the first hole of the lower pole piece so as to delimit a gap, wherein the magnetic field formed by the objective lens leaks from the gap and has an intensity which increases toward the surface of the specimen.

16. An electron beam apparatus for observing a specimen having recesses, comprising:
 means for generating an electron beam;
 an objective lens for irradiating the beam on said specimen, said objective lens forming a focusing magnetic field on the surface of said specimen and having a pole piece hole through which said electron beam passes;
 an electrode for generating an electric field sufficient to draw out electrons characteristic of said specimen which are discharged from a recess in said specimen to the outside of said recess;
 detection means for detecting said electrons, said electrode being interposed between said detection means and said specimen; and
 means for scanning the electron beam on said specimen, where the scanning rate of said electron beam is 10 frames or more/second, the accelerating voltage of said electron beam is 1 kV or less and the electron beam amount of said electron beam is 10-11 A or less.

17. An electron beam apparatus for observing a specimen having recesses, comprising:
 means for generating an electron beam;
 an objective lens for irradiating the beam on said specimen, said objective lens forming a focusing magnetic field on the surface of said specimen and having a pole piece hole through which said electron beam passes;
 an electrode for generating an electric field sufficient to draw out electrons characteristic of said specimen which are discharged from a recess in said specimen to the outside of said recess;
 detection means for detecting said electrons, said electrode being interposed between said detection means and said specimens; and
 means for charging positively the surface of said specimen at at least the peripheral edge of said recess.

18. An electron beam apparatus according to claim 17 wherein said charge means includes means for scanning said electron beam on said specimen, where the scanning rate of said electron beam is 10 frames or more/second, the accelerating voltage of said electron beam is 1 kV or less and the electron beam amount of said electron beam is $10^{-11}$ A or less.

19. An electron beam apparatus according to claim 17 further comprising means for checking whether or not the surface of said specimen is charged positively.

20. An electron beam apparatus for observing a specimen having recesses, comprising:
 means for generating an electron beam;
 means for irradiating the beam on said specimen;
 an electrode for generating a electric field sufficient to draw out electrons characteristic of said specimen which are discharged from a recess in said specimen by said beam to the outside of said recess;
 means for generating a magnetic field for focusing said electrons drawn out of said recess;
 means for storing first control data necessary for obtaining a desired detection result when said electric field is generated;
 means for storing second control data necessary for obtaining a desired detection result when said electric field is not applied to the specimen; and means for selecting said first control data or said second control data and controlling associated components of said electron beam apparatus on the basis of selected data.

21. An electron beam apparatus according to claim 20 wherein an object to be controlled by said first and second control data is at least one of optical alignment, stigmating, imaging magnification, imaging field, focusing and background level of a scanning image.

22. An electron beam apparatus according to claim 20 wherein said first control data is so set as to correct a change in checking result which is caused by acceleration of said electron beam by said electric field.

23. An electron beam apparatus according to claim 20 wherein said irradiating means includes an objective lens having a pole piece hole through which said electron beam passes, and said electrode is a cylindrical electrode disposed on the peripheral wall of said pole piece hole concentrically therewith and applied with positive voltage relative to said specimen.

24. An electron beam apparatus according to claim 20 further comprising a second electrode interposed between said electrode and said detection means and operable to adjust an electric field between said electrode and said detection means.

25. An electron beam apparatus according to claim 23 wherein said cylindrical electrode is divided, along the optical axis of said beam, into a plurality of divisional electrodes which are controlled independently of each other.

26. An electron beam apparatus according to claim 20 further comprising means, interposed between said electrode and said specimen, for deflecting said electron beam.

27. A charged particle beam apparatus for observing a specimen having recesses, comprising:
 means for generating a charged particle beam;
 means for irradiating the beam on said specimen;
 an electrode for generating an electric field sufficient to draw out electrons characteristic of said specimen which are discharged from a recess in said specimen under irradiation of said beam to the outside of said recess;
 means for generating a magnetic field for focusing said electrons drawn out of said recess;
 means for detecting said electrons; means for storing first control data necessary for obtaining a desired detection result when said electric field is generated; and
 means for storing second control data necessary for obtaining a desired detection result when said electric field is not generated.

28. An electron beam apparatus for observing a specimen, comprising:
 a unit for generating an electron beam;
 means for irradiating the beam on said specimen;
 an electrode for applying an electric field to said specimen and causing electrons, discharged from said specimen by said beam and being characteristic of said specimen, to leave said specimen;
 means for detecting said electrons;
 means for storing first control data necessary for obtaining a desired checking result when said electric field is applied to said specimen; and
 means for storing second control data necessary for obtaining a desired checking result when said electric field is not applied to said specimen.

29. A scanning electron microscope for scanning an electron beam spot at an observation area on a specimen and fetching a signal generated secondarily from said observation area to produce an observation image, comprising:
- first imaging magnification setting means for setting a desired observation imaging magnification;
- second imaging magnification setting means for setting at least one of an imaging magnification lower than the observation imaging magnification higher than the observation imaging magnification; and
- means for performing image observation in any one of first to third observation modes of which the first mode is such that an electron beam is irradiated for a predetermined period of time at the low imaging magnification and thereafter image observation is effected at the observation imaging magnification, the second mode is such that an electron beam is irradiated for a predetermined period of time at the high imaging magnification and thereafter observation is effected at the observation imaging magnification and the third mode is such that an electron beam is irradiated for a predetermined period of time at one of the low imaging magnification and high imaging magnification, then an electron is further irradiated for a predetermined period of time at the other imaging magnification and thereafter observation is effected at the observation imaging magnification.

30. An observation method in a scanning electron microscope for scanning an electron beam spot at an observation area on a specimen and fetching a signal generated secondarily from said observation area to produce an observation image, comprising irradiating a first electron beam at a first imaging magnification for a predetermined period of time on an area including at least a predetermined observation area and thereafter irradiating a second electron beam at second imaging magnification larger than the first imaging magnification on said predetermined observation area to perform image observation.

31. An observation method in a scanning electron microscope for scanning an electron beam spot at an observation area on a specimen and fetching a signal generated secondarily from said observation area to produce an observation image, comprising irradiating a first electron beam at a first imaging magnification for a predetermined period of time on an area including at least a predetermined observation area and thereafter irradiating a second electron beam at a second imaging magnification smaller than the first imaging magnification on said predetermined observation area to perform image observation.

32. An electron beam apparatus for observing a specimen having a recess in its surface, comprising:
- means for generating an electron beam;
- an objective lens for irradiating and focusing the beam on the surface of the specimen, the objective lens forming a magnetic field substantially focused on the surface of the specimen;
- the objective lens including an upper pole piece delimiting a first hole and a lower pole piece delimiting a second hole, a size of the second hole being larger than a size of the first hole at least at opposing surfaces of the upper and lower pole pieces of the objective lens, the beam passing through the first and second holes of the upper and lower pole pieces of the objective lens;
- an electrode disposed in the objective lens for generating an electric field on the surface of the specimen and by which, together with the magnetic field, cause electrons characteristic of the specimen which are being discharged from the recess to be drawn out of the recess; and
- a detector for detecting the electrons.

* * * * *

UNITED STATES PATENT AND TRADEMARK OFFICE
CERTIFICATE OF CORRECTION

PATENT NO. : 5,412,209
DATED : May 2, 1995
INVENTOR(S) : OTAKA, et al

It is certified that error appears in the above-identified patent and that said Letters Patent is hereby corrected as shown below:

On the title page: item [73] should read

[73] Hitachi, Ltd. of Tokyo, Japan
     Hitachi Instruments Engineering Co. &
     Hitachi Science Systems, Ltd., both of
     Katsuta-shi, Japan Signed and Sealed this Fifth Day of March, 1996

Attest:

BRUCE LEHMAN

*Attesting Officer*    *Commissioner of Patents and Trademarks*